United States Patent
Lee et al.

(10) Patent No.: US 8,503,229 B2
(45) Date of Patent: Aug. 6, 2013

(54) P-/METAL FLOATING GATE NON-VOLATILE STORAGE ELEMENT

(75) Inventors: Sanghyun Lee, Davis, CA (US); Mohan Dunga, Santa Clara, CA (US); Masaaki Higashitani, Cupertino, CA (US); Tuan Pham, San Jose, CA (US); Franz Kreupl, Munich (DE)

(73) Assignee: SanDisk Technologies Inc., Plano, TX (US)

( * ) Notice: Subject to any disclaimer, the term of this patent is extended or adjusted under 35 U.S.C. 154(b) by 52 days.

(21) Appl. No.: 13/153,964

(22) Filed: Jun. 6, 2011

(65) Prior Publication Data

US 2012/0243337 A1    Sep. 27, 2012

Related U.S. Application Data

(60) Provisional application No. 61/466,295, filed on Mar. 22, 2011.

(51) Int. Cl.
*G11C 11/34* (2006.01)
*G11C 16/04* (2006.01)
*H01L 29/94* (2006.01)
*H01L 21/00* (2006.01)
*H01L 21/8238* (2006.01)

(52) U.S. Cl.
USPC .......... 365/185.01; 365/174; 438/3; 438/201; 257/315

(58) Field of Classification Search
USPC .................. 365/185.01, 174; 257/315; 438/3, 438/201
See application file for complete search history.

(56) References Cited

U.S. PATENT DOCUMENTS

| | | | |
|---|---|---|---|
| 5,604,357 A | 2/1997 | Hori | |
| 5,717,237 A | 2/1998 | Chi | |
| 5,753,952 A | 5/1998 | Mehrad | |
| 6,630,383 B1 | 10/2003 | Ibok et al. | |
| 6,790,729 B1 | 9/2004 | Woo | |
| 2005/0079671 A1 | 4/2005 | Chen et al. | |
| 2006/0237768 A1* | 10/2006 | Forbes et al. | 257/314 |
| 2006/0278917 A1 | 12/2006 | Forbes et al. | |
| 2007/0082495 A1 | 4/2007 | Mathew et al. | |
| 2007/0132004 A1 | 6/2007 | Yasuda et al. | |

(Continued)

FOREIGN PATENT DOCUMENTS

EP    2068351 A1    6/2009

OTHER PUBLICATIONS

International Search Report and Written Opinion of the International Searching Authority dated May 31, 2012, PCT Application No. PCT/US2012/027920 filed Mar. 6, 2012, 13 pages.

(Continued)

*Primary Examiner* — Ly D Pham
(74) *Attorney, Agent, or Firm* — Vierra Magen Marcus LLP

(57) ABSTRACT

Non-volatile storage elements having a P-/metal floating gate are disclosed herein. The floating gate may have a P- region near the tunnel oxide, and may have a metal region near the control gate. A P- region near the tunnel oxide helps provide good data retention. A metal region near the control gate helps to achieve a good coupling ratio between the control gate and floating gate. Therefore, programming of non-volatile storage elements is efficient. Also, erasing the non-volatile storage elements may be efficient. In some embodiments, having a P- region near the tunnel oxide (as opposed to a strongly doped p-type semiconductor) may improve erase efficiency relative to P+.

18 Claims, 34 Drawing Sheets

U.S. PATENT DOCUMENTS

2007/0145462 A1* 6/2007 Eldridge et al. .............. 257/314
2009/0140313 A1 6/2009 Joo
2009/0283817 A1 11/2009 Krishnamohan et al.
2012/0228691 A1 9/2012 Dunga et al.

OTHER PUBLICATIONS

Partial International Search Report and Written Opinion of the International Searching Authority dated Jun. 27, 2012, PCT Application No. PCT/US2012/029133, filed Mar. 14, 2012, 2 pages.

International Search Report and Written Opinion of the International Searching Authority dated Aug. 8, 2012, PCT Application No. PCT/US2012/029133, filed Mar. 14, 2012, 18 pages.

Chung, Steve S., et al., "A Novel High Performance and Reliability p-Type Floating Gate N-Channel Flash EEPROM," 1999 Symposium on VLSI Technology Digest of Technical Papers, Jun. 1999, pp. 19-20, Kyoto, Japan.

Chen, Shen, et al., "P-Type Floating Gate for Retention and P/E Window Improvement of Flash Memory Devices," IEEE Transactions on Electron Devices, Aug. 2007, pp. 1910-1917, vol. 54, No. 8, IEEE Electron Devices Society.

Blomme, Pieter, et al., "Novel Dual Layer Floating Gate Structure as Enabler of Fully Planar Flash Memory," 2010 Symposium on VLSI Technology Digest of Technical Papers, Jun. 2010, pp. 129-130, Honolulu, Hawaii, USA.

U.S. Appl. No. 13/072,130, filed Mar. 25, 2011.

Office Action dated Feb. 15, 2013, U.S. Appl. No. 13/072,130, filed Mar. 25, 2011, 24 pages.

Response to Office Action dated May 10, 2013, U.S. Appl. No. 13/072,130, filed Mar. 25, 2011, 9 pages.

* cited by examiner

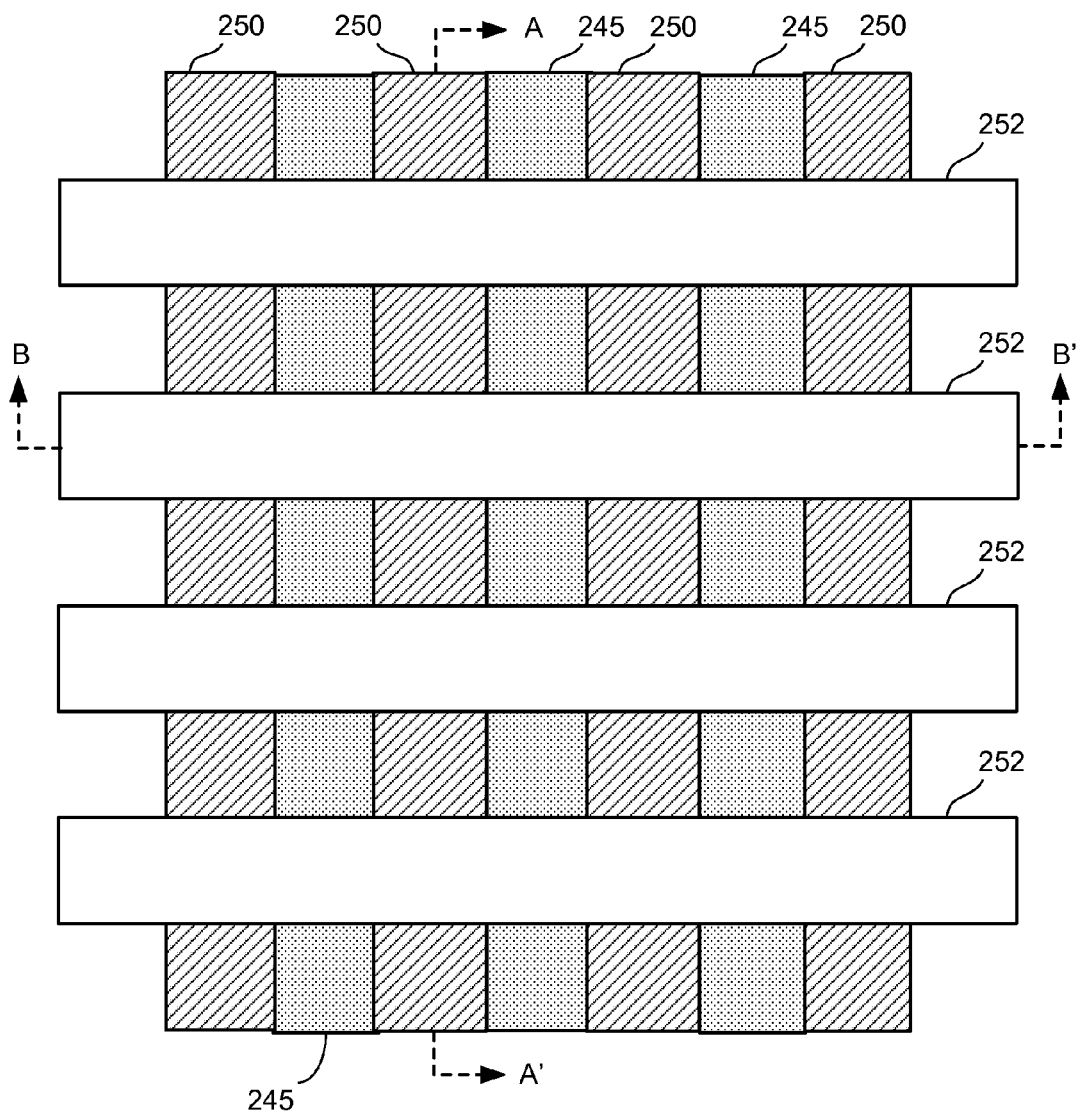

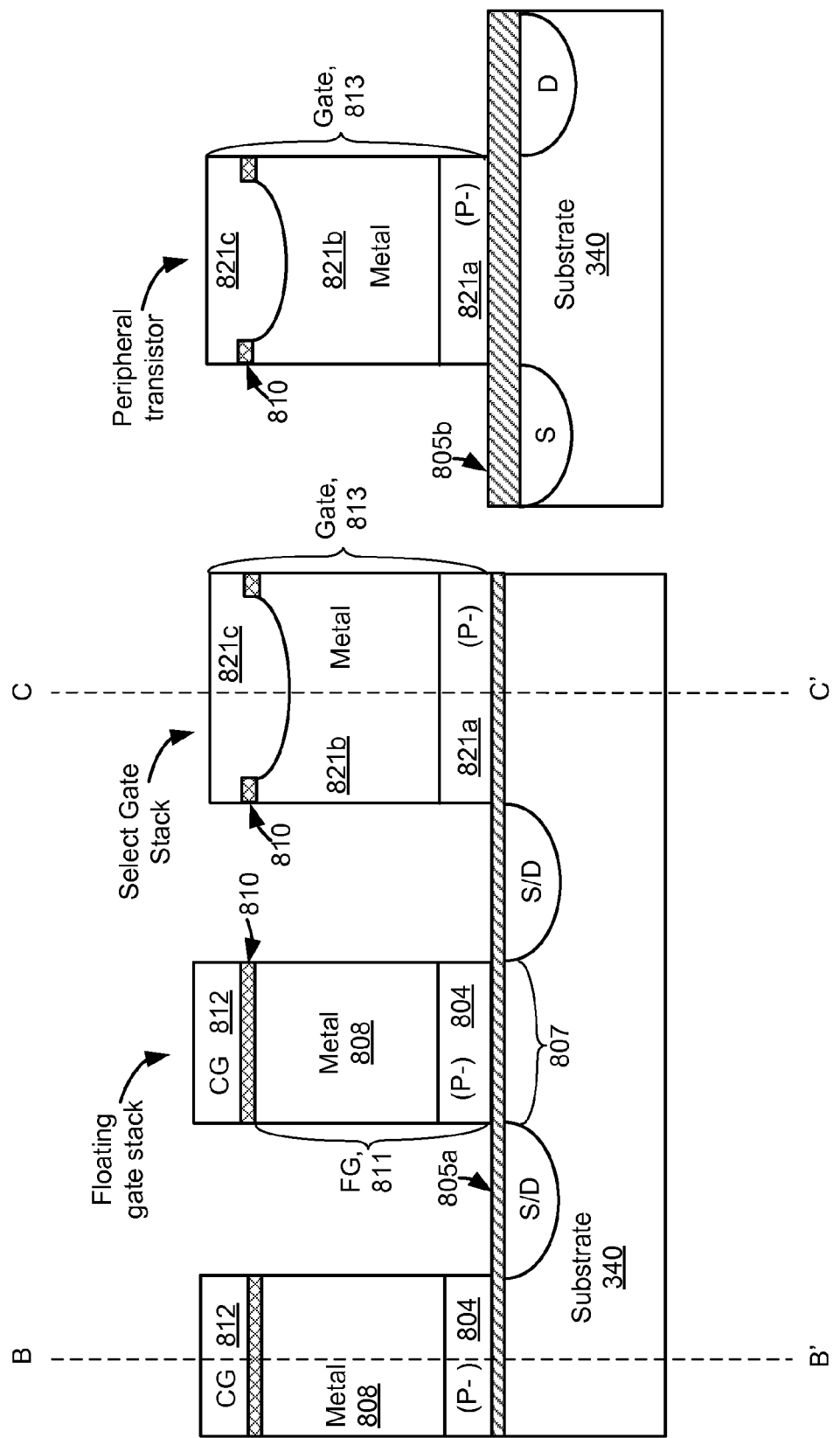

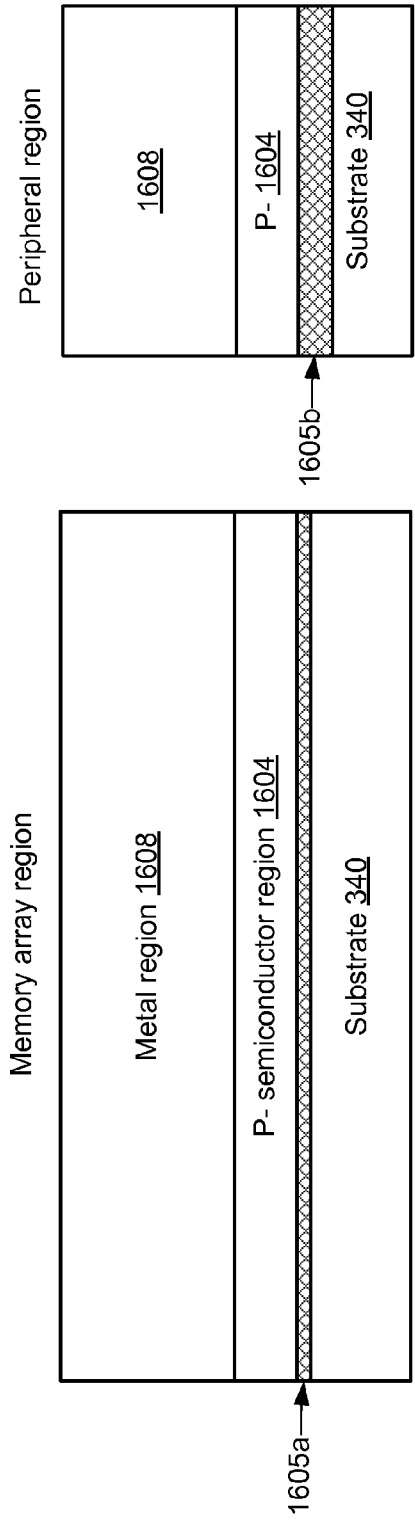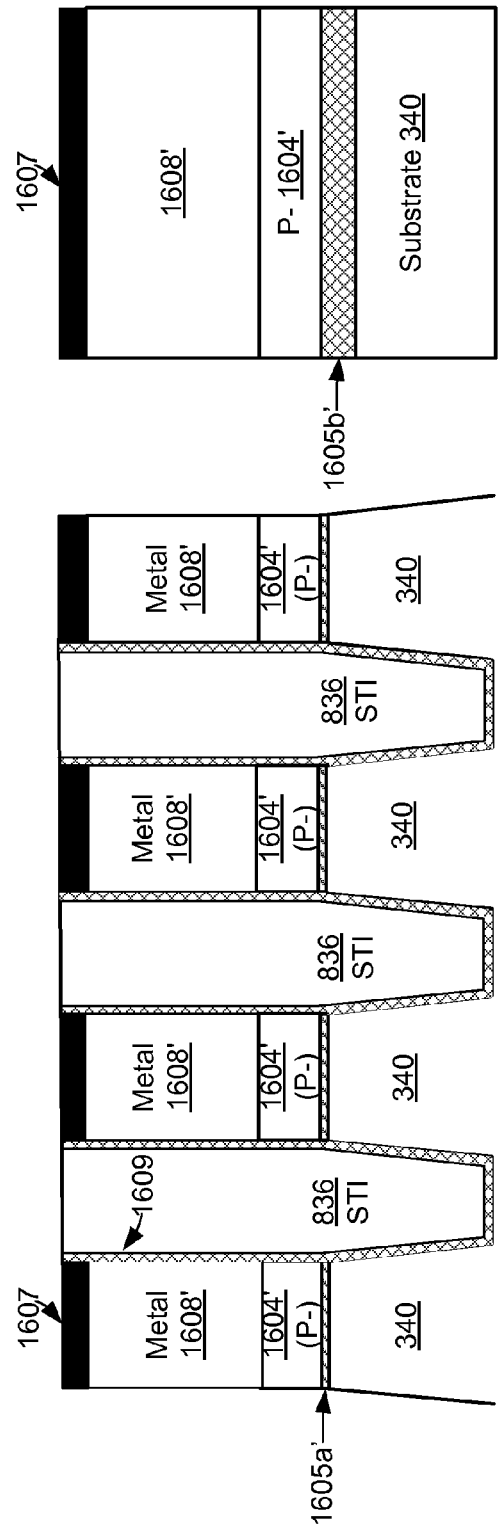
Fig. 16A
Fig. 16B

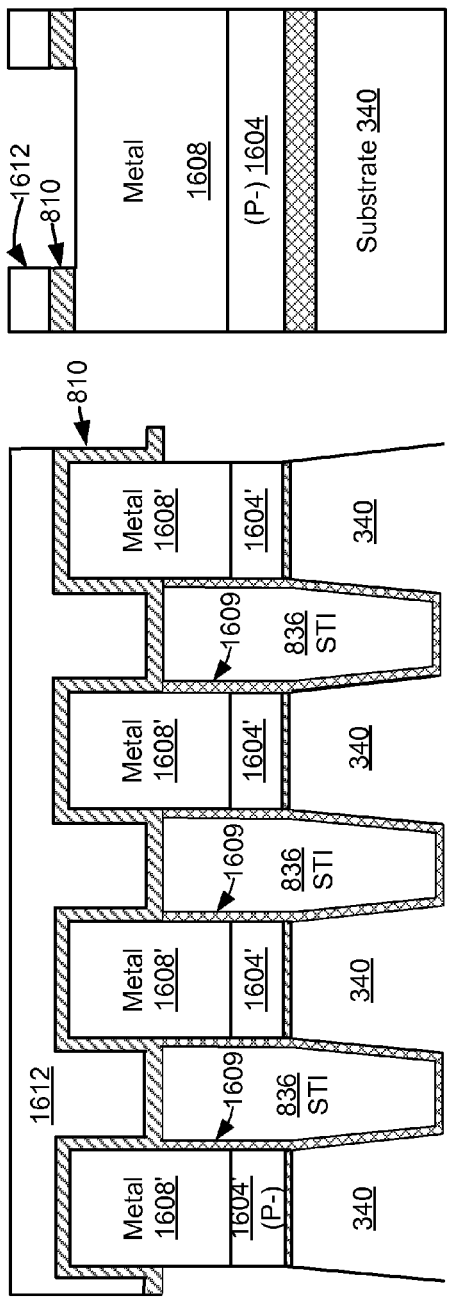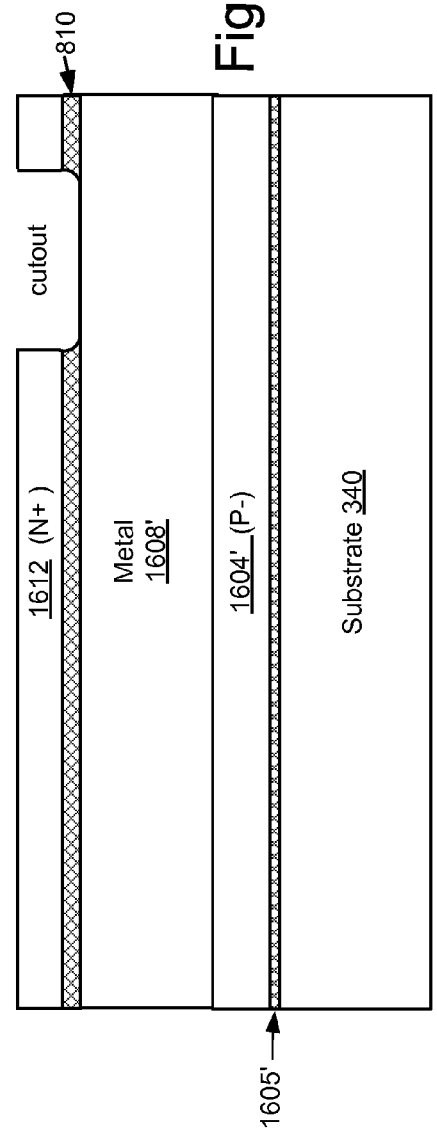

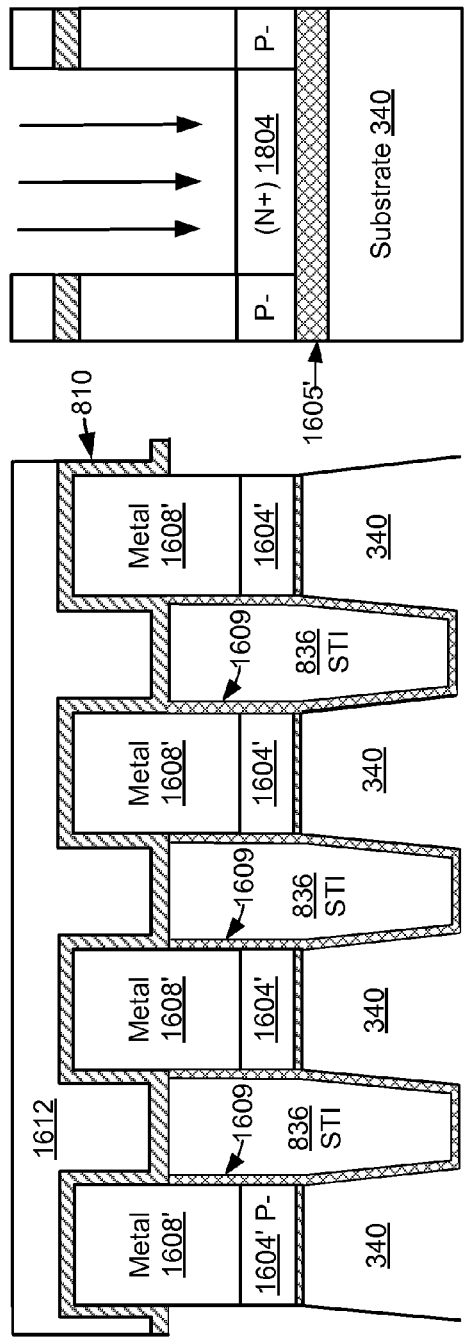
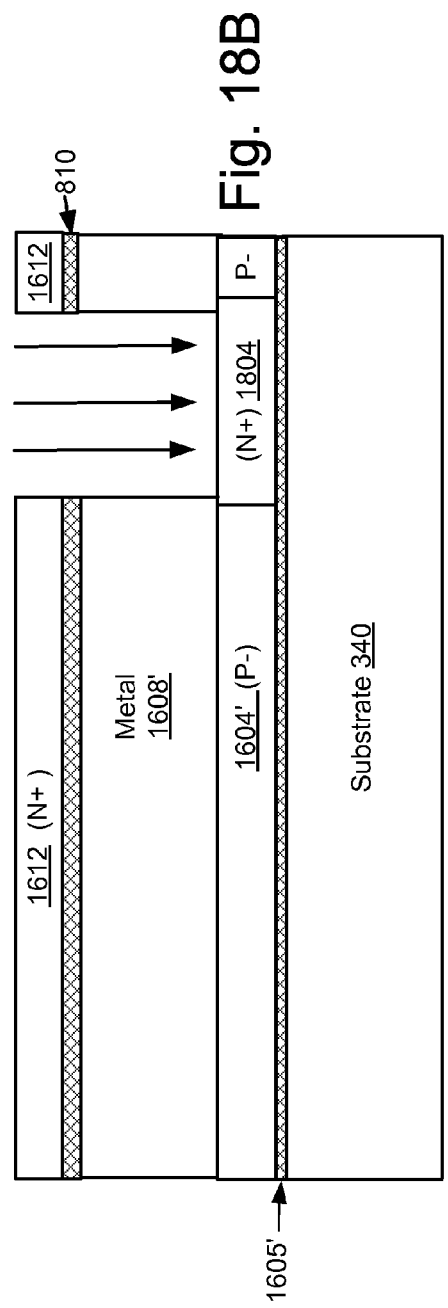

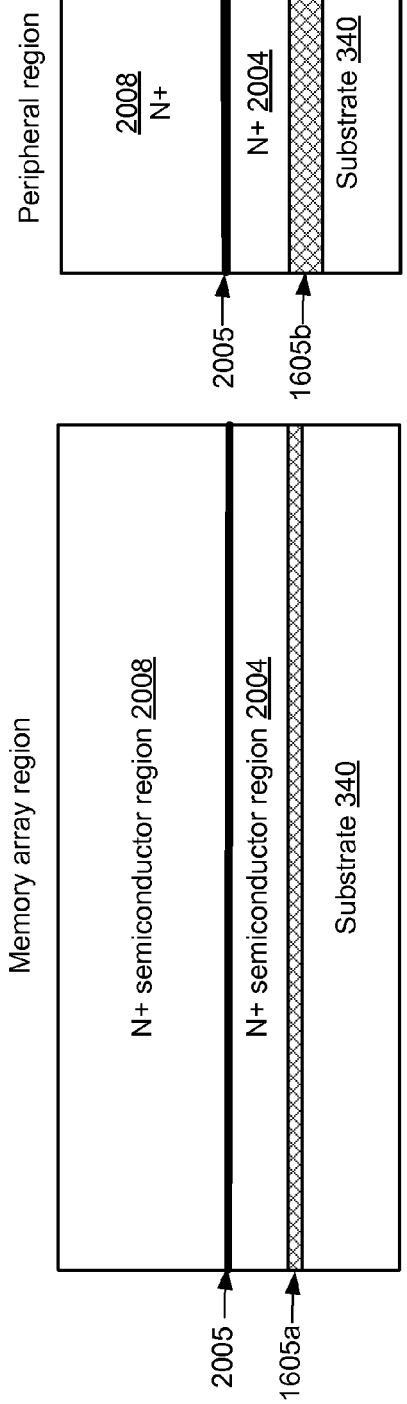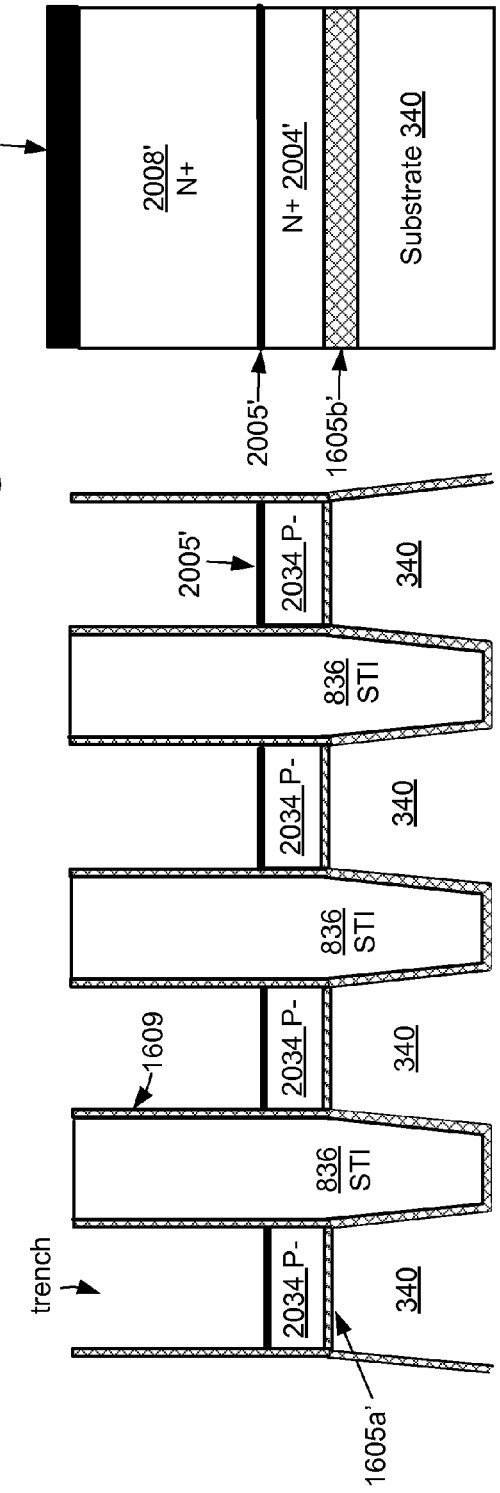
Fig. 20A
Fig. 20B

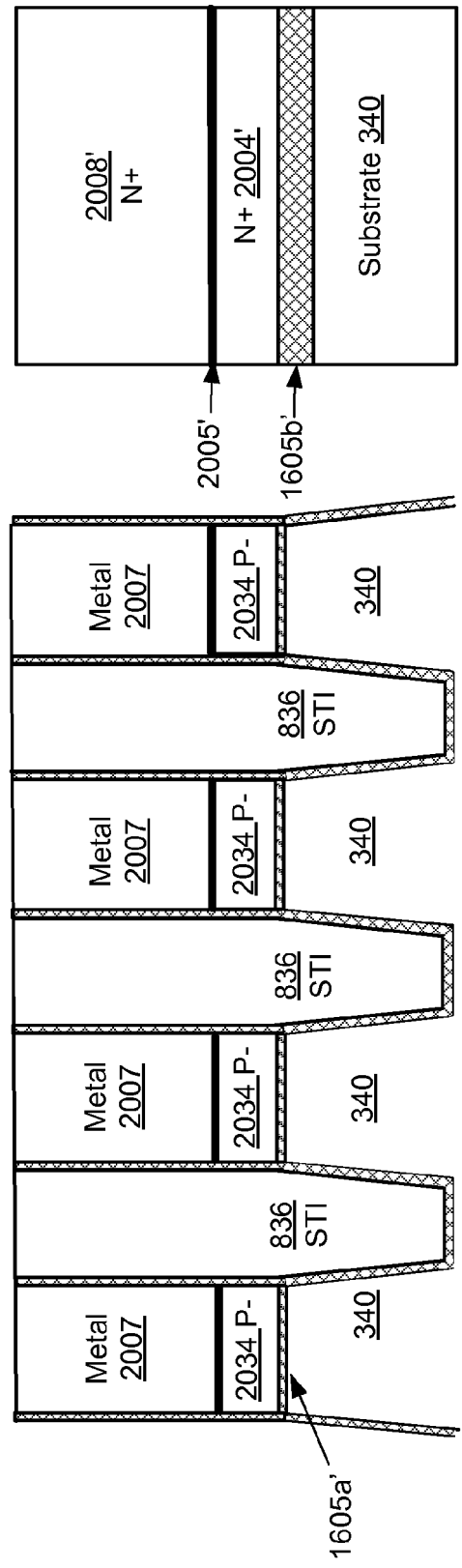

P-/METAL FLOATING GATE NON-VOLATILE STORAGE ELEMENT

PRIORITY

This application claims the benefit of U.S. Provisional Application No. 61/466,295, entitled "P-/Metal Floating Gate Non-Volatile Storage Element," by Lee et al., filed on Mar. 22, 2011, incorporated herein by reference.

BACKGROUND

1. Field

This disclosure relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory utilize a floating gate that is positioned above and insulated from a channel region in a semiconductor substrate. Typically, a "tunnel oxide" insulates the floating gate from the channel. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

One issue of concern is data retention. Over time, charge on the floating gate may be lost or gained across the tunnel oxide, thereby changing the threshold voltage. It is also possible to lose or gain charge across the insulator the separates the floating gate from the control gate. For some devices, losing or gaining charge across the tunnel oxide is a greater problem of these two effects.

Another phenomenon that presents problems is stress induced leakage currents (SILC). Programming and erasing memory cells may stress the insulator below the floating gates. This stress may result in a greater leakage current through the insulator.

Another problem is program saturation. When a high program voltage is applied to the control gate, the tunneling of electrons should occur through the tunnel oxide between the substrate and the floating gate. However, tunneling should not occur through the inter-gate oxide between the control gate and the floating gate. If, however, electrons do tunnel through the inter-gate oxide then programming saturates.

For some memory arrays, with continued scaling the individual threshold voltage ranges that define each state are getting wider. If the individual threshold voltage ranges are wider, then the margin between the threshold voltage ranges becomes smaller (assuming the same overall width for all threshold voltage ranges). The smaller margin between threshold voltage distributions makes data retention a more significant issue.

BRIEF DESCRIPTION OF THE DRAWINGS

FIG. 2B is a top view of the three NAND strings and word lines.

FIG. 8A depicts one embodiment of non-volatile storage elements and transistors.

FIGS. 16A, 16B, 16C, 16D, and 16E depict results after various steps of the process of FIG. 15B.

FIGS. 18A and 18B show results after various steps the process of FIG. 17A.

FIGS. 20A, 20B, and 20C show results after various steps the process of FIG. 19.

DETAILED DESCRIPTION

With continued scaling of memory arrays, such as NAND flash, the programmed states may become wider; therefore, this leaves smaller margins for data retention and SILC. Furthermore, scaling the tunnel oxide (e.g., reducing the tunnel oxide thickness) may not be possible due to necessary margins for data retention and degradation related to SILC. Technology disclosed herein includes a "P−/Metal" floating gate in a non-volatile storage device. The P−/Metal floating gate may improve data retention margins while providing about the same coupling ratio as a floating gate that is entirely "N+". Having a good coupling ratio may mean that programming speed is not sacrificed. Improved data retention may, in effect, allow a greater margin between programmed states and/or may enable reduction of tunnel oxide thickness.

Non-volatile storage elements having a P−/Metal floating gate are disclosed herein. The floating gate may have a P− region near the tunnel oxide, and may have a metal region near the control gate. In some embodiments, the metal has a high electron work function. This may help to reduce program saturation. Example metals for the floating gate include, but are not limited to, W, WN, TiN, TaN, Mo, and TiO.

In some embodiments, a P− region near the tunnel oxide helps provide good data retention. In some embodiments, a metal region near the control gate helps to achieve a good coupling ratio between the control gate and floating gate. Therefore, programming of non-volatile storage elements is efficient. Also embodiments erase the non-volatile storage elements efficiently. In some embodiments, having a P− region near the tunnel oxide (as opposed to a strongly doped p-type semiconductor) improves erase efficiency relative to P+.

Note that techniques for fabricating non-volatile storage devices are compatible with those for fabricating transistors. Also note that for some transistors, it might not be desirable to have a P− region near the gate oxide. Techniques are described herein for efficiently fabricating memory cells with P− regions near the tunnel oxide, along with transistors with N+ regions near the gate oxide.

Example Memory System and Operation

Figure 1A:
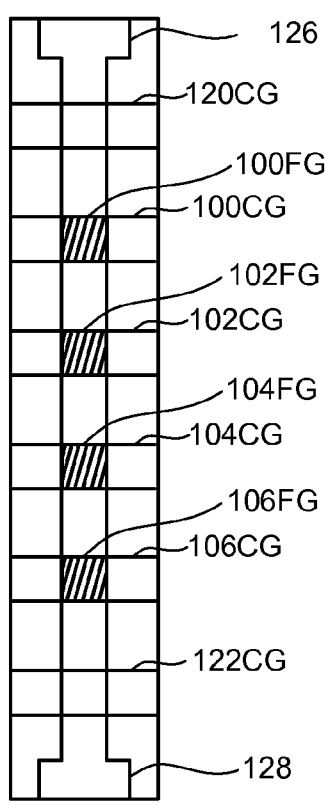
FIG. 1A is a top view of a NAND string.
Figure 1B:
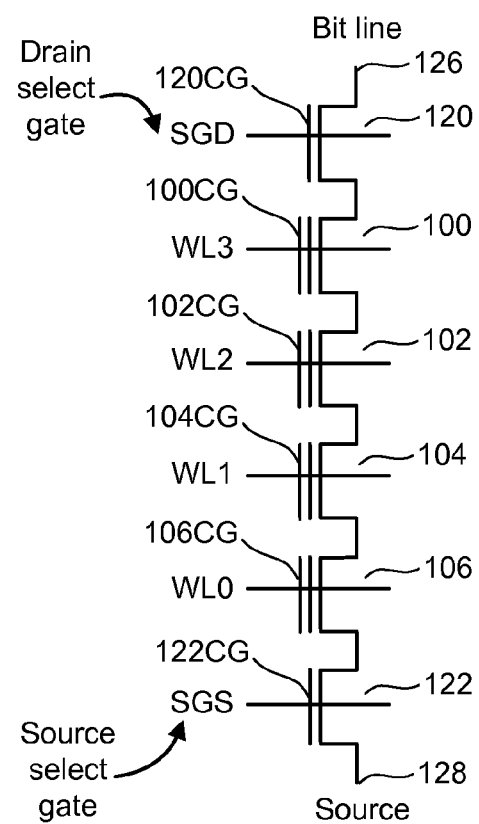
FIG. 1B is an equivalent circuit diagram of the NAND string of FIG. 1A.

One example of a memory system suitable for implementing embodiments uses a NAND flash memory architecture, which includes connecting multiple transistors in series between two select gates. The transistors connected in series and the select gates are referred to as a NAND string. FIG. 1A is a top view showing one NAND string. FIG. 1B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Figure 2A:
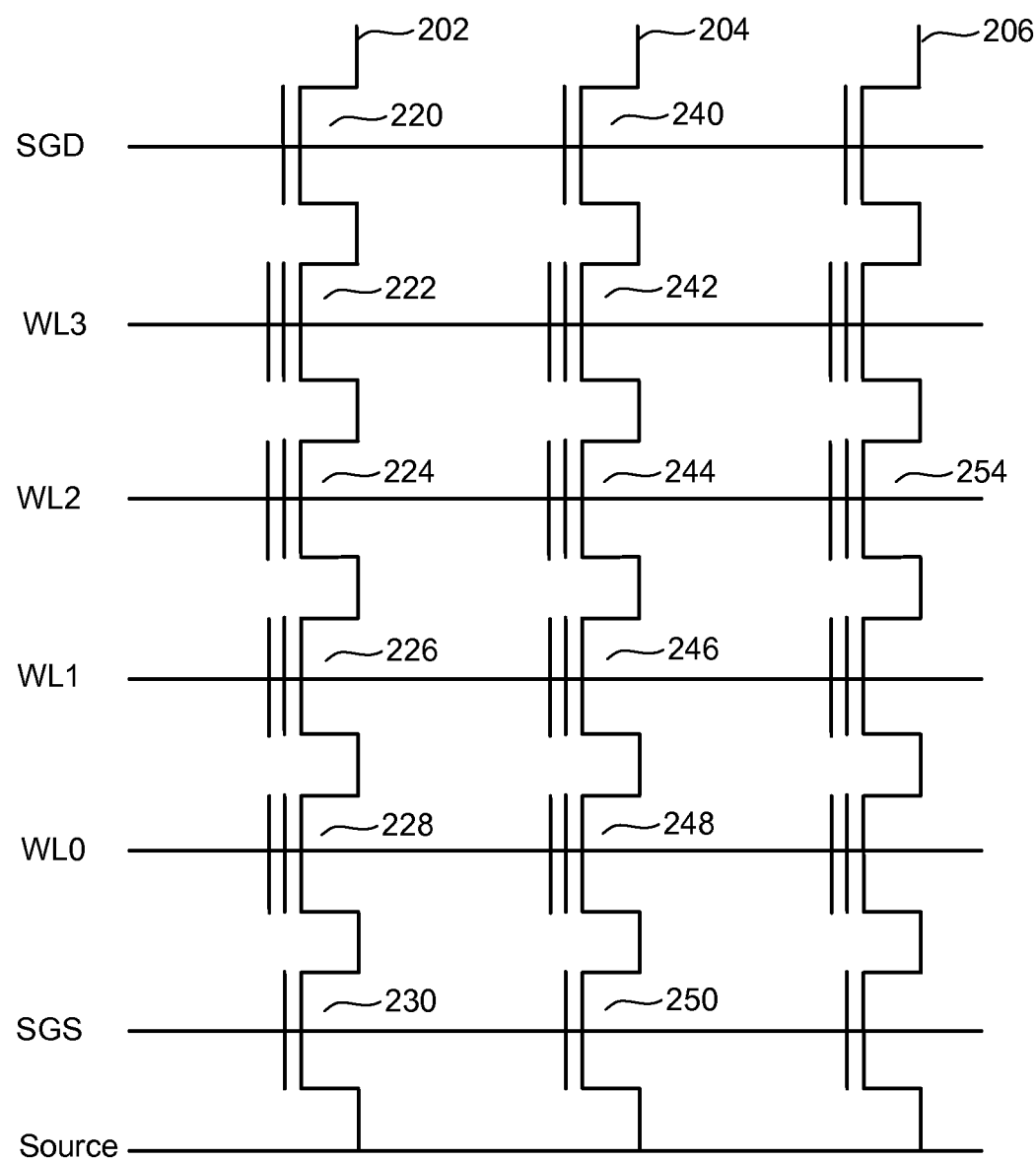
FIG. 2A is a circuit diagram of three NAND strings with associated word lines.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g., select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprises the columns of the array of memory cells. The word lines (WL3, WL2, WL1 and WL0) comprise the rows of the array.

FIG. 2B is a top view of a portion of an array of NAND flash memory cells. The array includes bit lines 250 and word lines 252. Shallow trench isolation (STI) structures 245 are depicted between the bit lines 250 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2A, the program voltage will also be applied to the control gates of storage elements 244 and 254.

Figure 3:
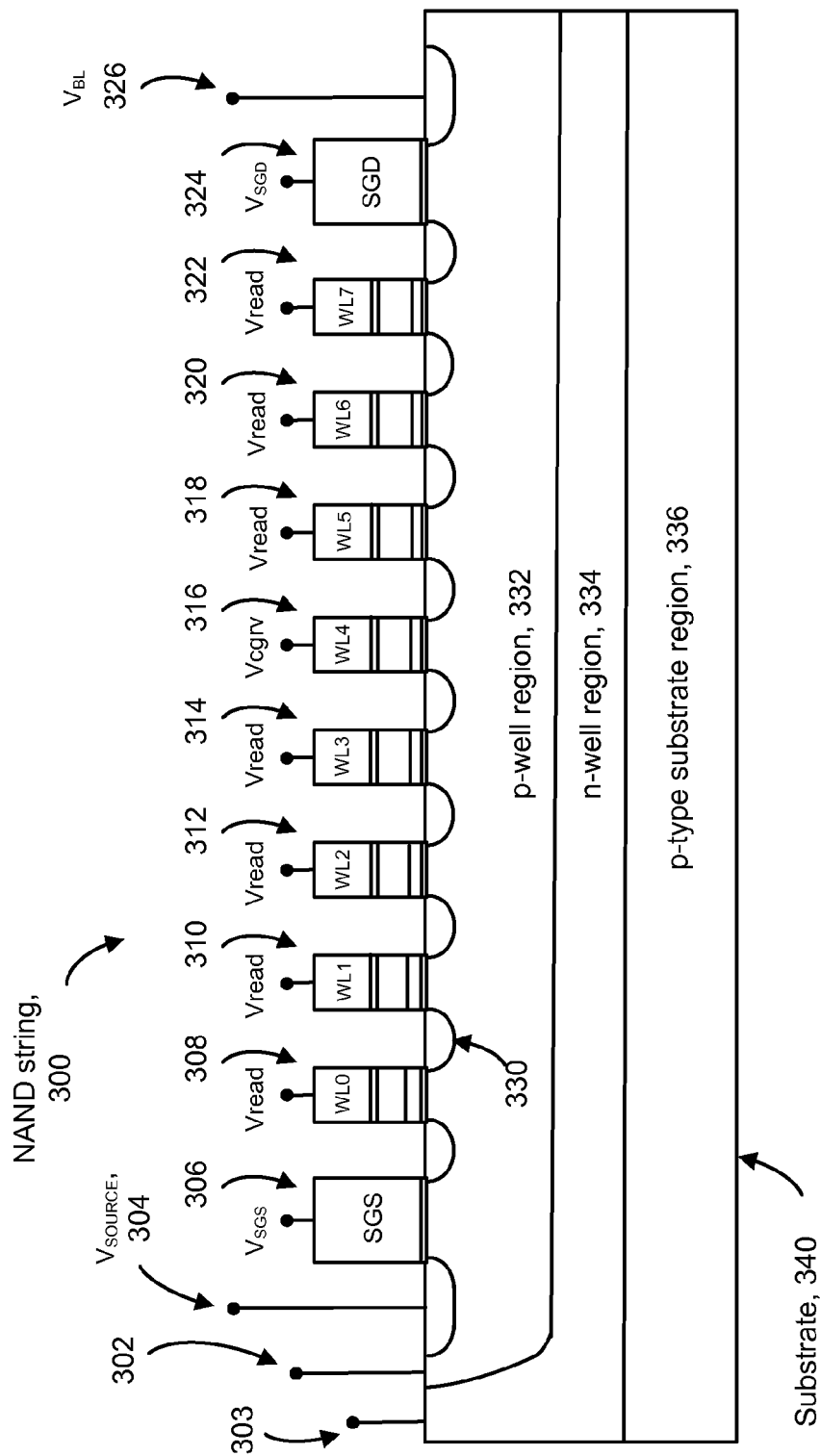
FIG. 3 depicts a cross-sectional view of a NAND string formed on a substrate.

FIG. 3 depicts a cross-sectional view of a NAND string formed on a substrate. The view is simplified and not to scale. The NAND string 300 includes a source-side select gate 306, a drain-side select gate 324, and eight storage elements 308, 310, 312, 314, 316, 318, 320 and 322, formed on a substrate 340. A number of source/drain regions, one example of which is source/drain region 330, are provided on either side of each storage element and the select gates 306 and 324.

In one approach, the substrate 340 employs a triple-well technology which includes a p-well region 332 within an n-well region 334, which in turn is within a p-type substrate region 336. The NAND string and its non-volatile storage elements can be formed, at least in part, on the p-well region. A source supply line 304 with a potential of $V_{SOURCE}$ is provided in addition to a bit line 326 with a potential of $V_{BL}$. Voltages, such as body bias voltages, can also be applied to the p-well region 332 via a terminal 302 and/or to the n-well region 334 via a terminal 303. During a read or verify operation, a control gate voltage $V_{CGRV}$ is provided on a selected word line, in this example, WL4, which is associated with storage element 316. Further, recall that the control gate of a storage element may be provided as a portion of the word line.

For example, WL0, WL1, WL2, WL3, WL4, WL5, WL6 and WL7 can extend via the control gates of storage elements 308, 310, 312, 314, 316, 318, 320 and 322, respectively. A pass voltage, $V_{READ}$ is applied to the remaining word lines associated with NAND string 300. $V_{SGS}$ and $V_{SGD}$ are applied to the select gates 306 and 324, respectively.

Figure 4:
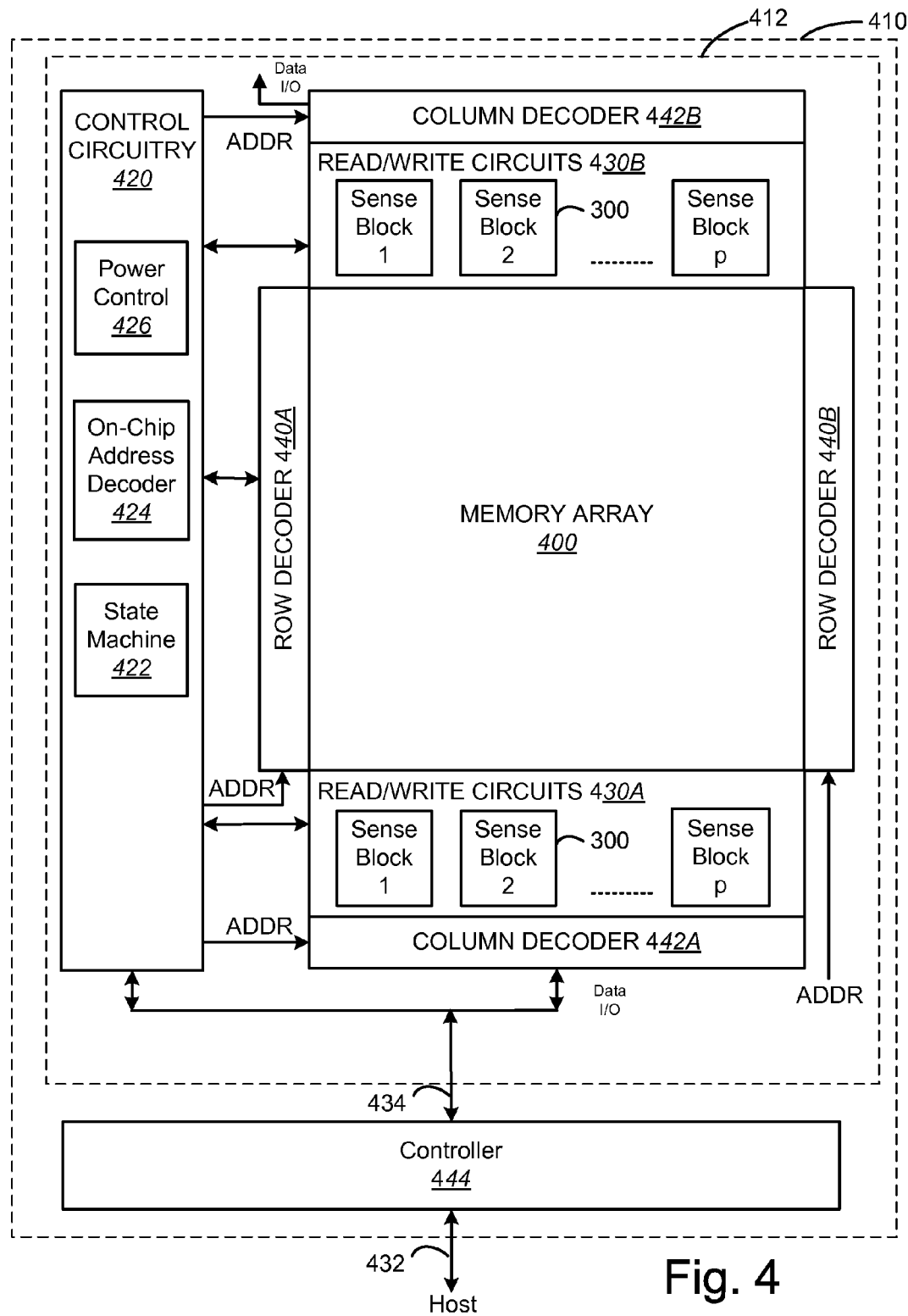
FIG. 4 illustrates a non-volatile storage device that may include one or more memory die or chips.

FIG. 4 illustrates a non-volatile storage device 410 that may include one or more memory die or chips 412. Memory die 412 includes an array (two-dimensional or three dimensional) of memory cells 400, control circuitry 420, and read/write circuits 430A and 430B. In one embodiment, access to the memory array 400 by the various peripheral circuits is implemented in a symmetric fashion, on opposite sides of the array, so that the densities of access lines and circuitry on each side are reduced by half. The read/write circuits 430A and 430B include multiple sense blocks 300 which allow a page of memory cells to be read or programmed in parallel. The memory array 400 is addressable by word lines via row decoders 440A and 440B and by bit lines via column decoders 442A and 442B. In a typical embodiment, a controller 444 is included in the same memory device 410 (e.g., a removable storage card or package) as the one or more memory die 412. Commands and data are transferred between the host and controller 444 via lines 432 and between the controller and the one or more memory die 412 via lines 434. One implementation can include multiple chips 412.

Control circuitry 420 cooperates with the read/write circuits 430A and 430B to perform memory operations on the memory array 400. The control circuitry 420 includes a state machine 422, an on-chip address decoder 424 and a power control module 426. The state machine 422 provides chip-level control of memory operations. The on-chip address decoder 424 provides an address interface to convert between the address that is used by the host or a memory controller to the hardware address used by the decoders 440A, 440B, 442A, and 442B. The power control module 426 controls the power and voltages supplied to the word lines and bit lines during memory operations. In one embodiment, power control module 426 includes one or more charge pumps that can create voltages larger than the supply voltage.

In one embodiment, one or any combination of control circuitry 420, power control circuit 426, decoder circuit 424, state machine circuit 422, decoder circuit 442A, decoder circuit 442B, decoder circuit 440A, decoder circuit 440B, read/write circuits 430A, read/write circuits 430B, and/or controller 444 can be referred to as one or more managing circuits.

Figure 5:
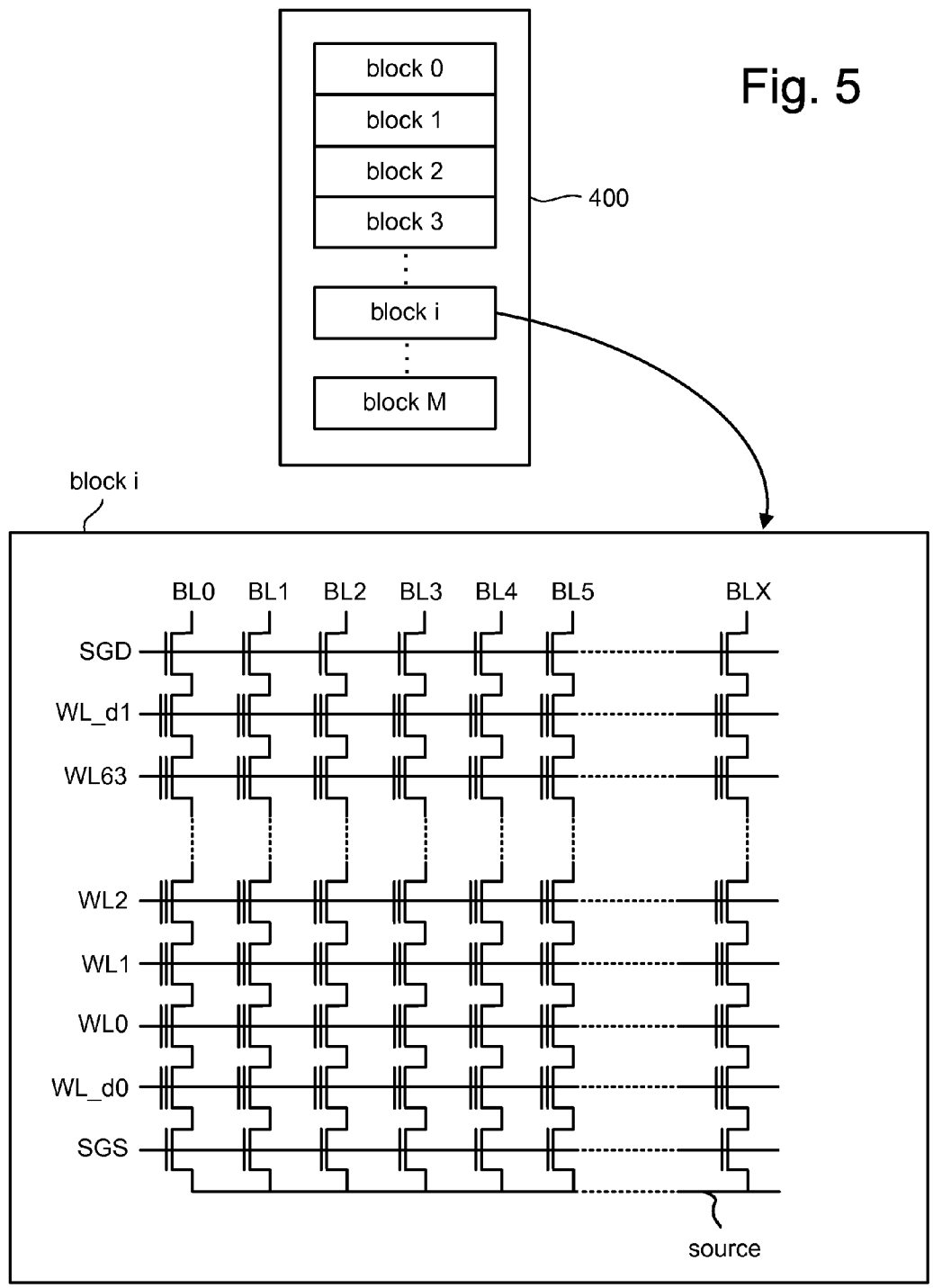
FIG. 5 depicts an exemplary structure of memory cell array.

FIG. 5 depicts an exemplary structure of memory cell array 400. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 400. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
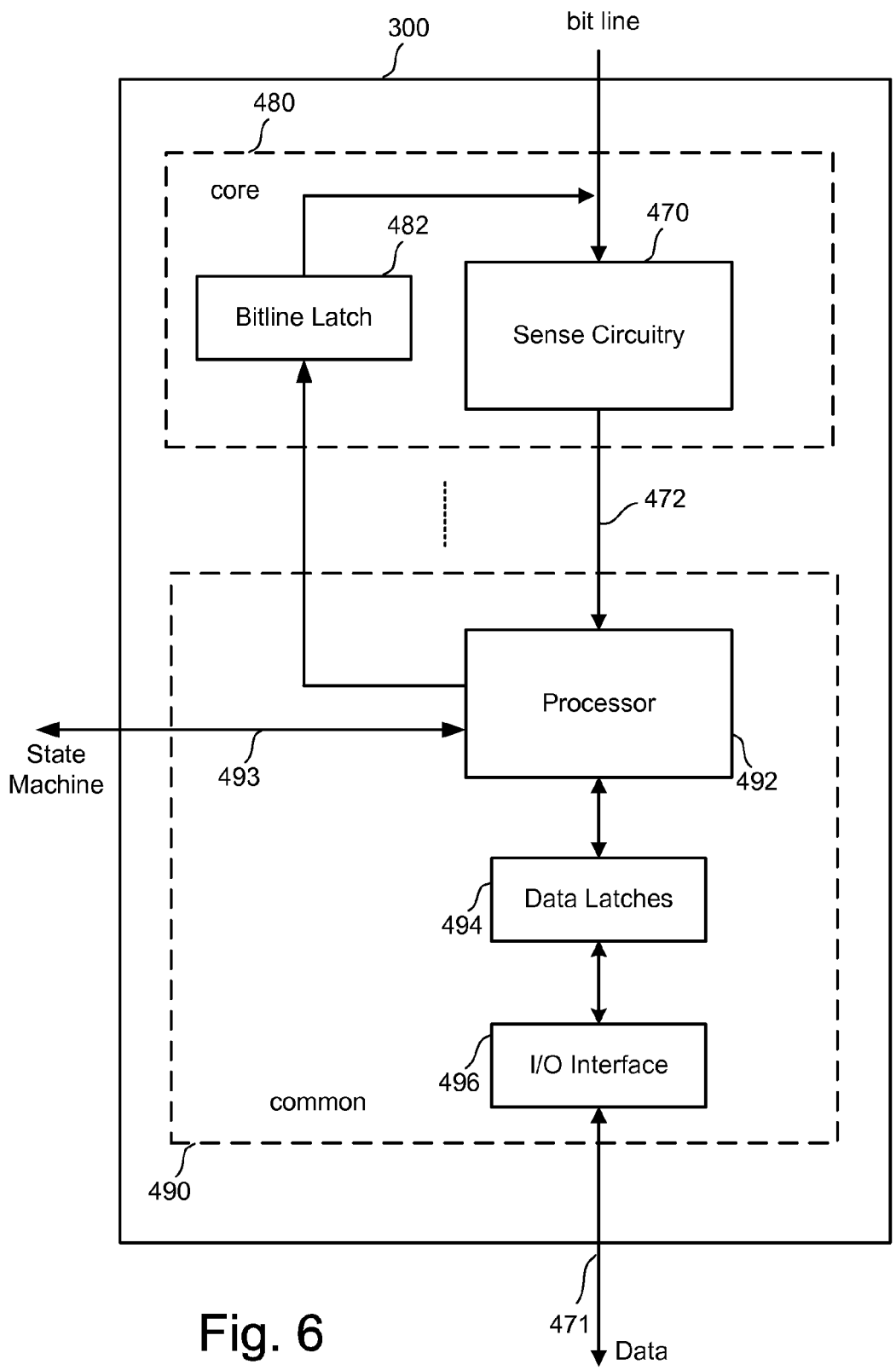
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is hereby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Figure 7:
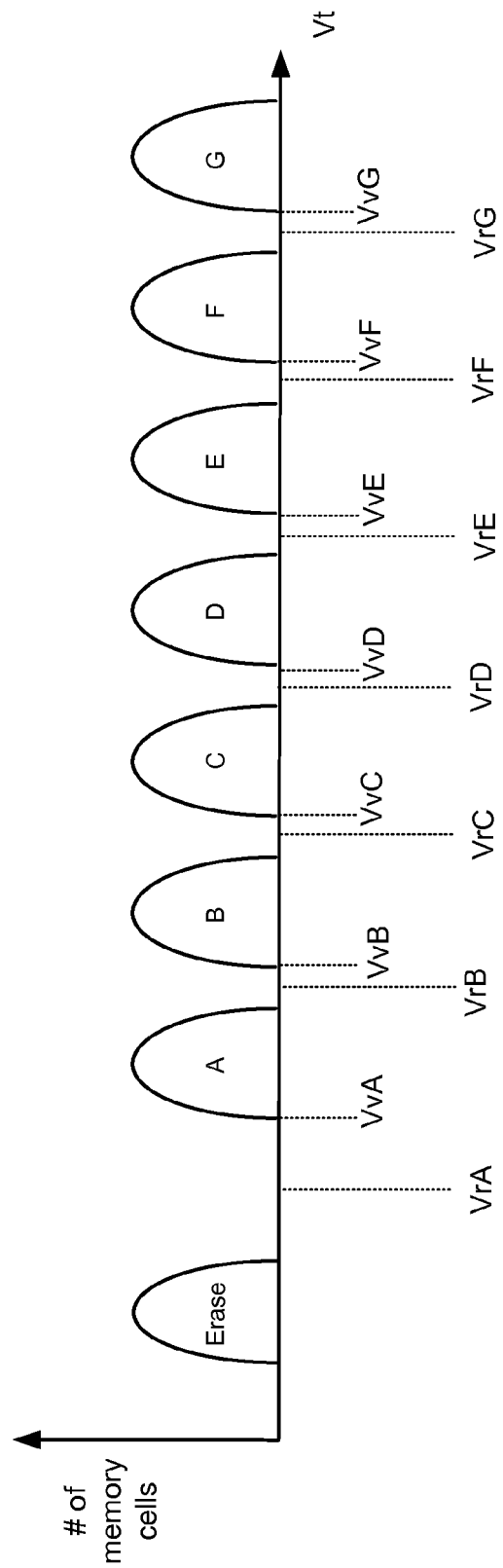
FIG. 7 depicts example threshold voltage distributions for states of memory cells in which there are eight states.

At the end of a successful programming process (with verification), the threshold voltages of the memory cells should be within one or more distributions of threshold voltages for programmed memory cells or within a distribution of threshold voltages for erased memory cells, as appropriate. FIG. 7 depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 7 shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 7 shows VvA for state A and VvB for state B, etc. When programming memory cells to a given state, the system will test whether those memory cells have a threshold voltage greater than or equal to the verify reference voltage.

Example Structures

Figure 8B:
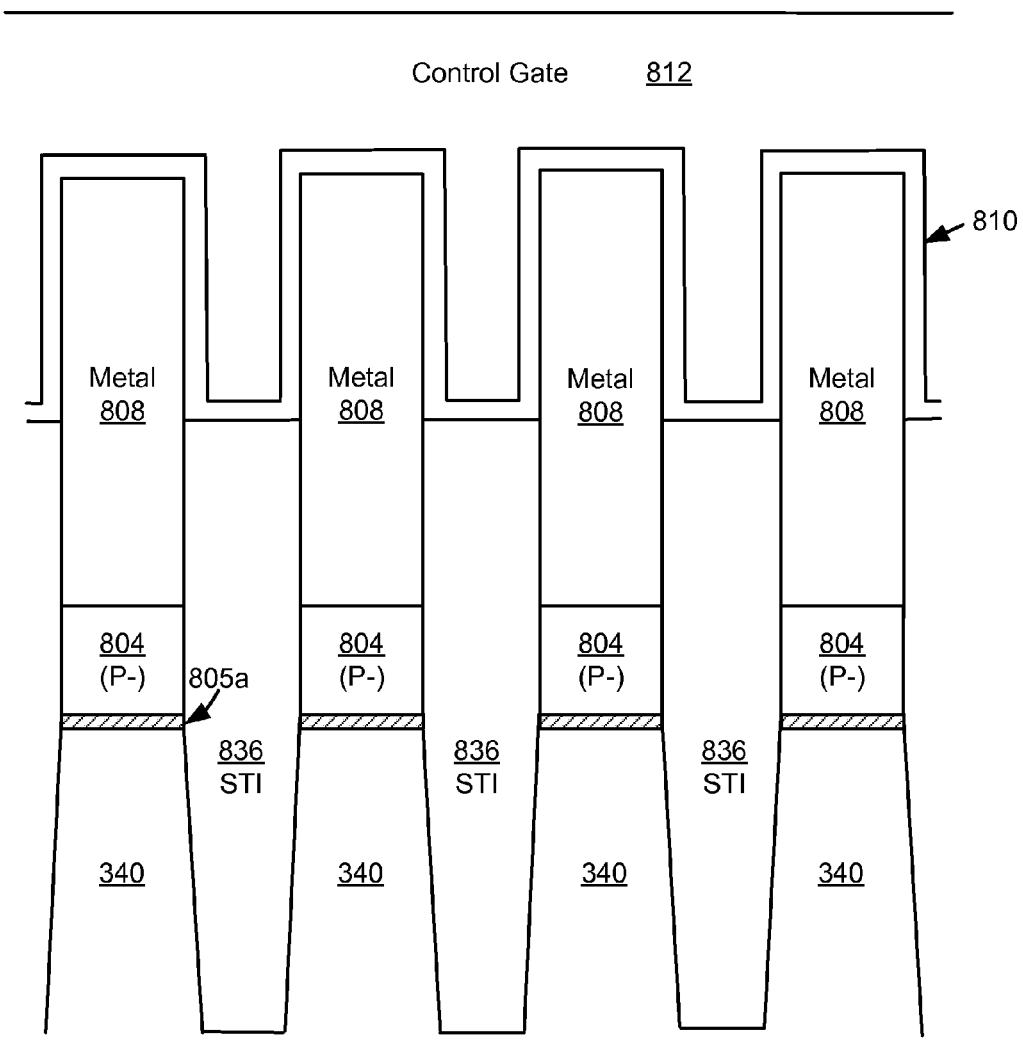
FIG. 8B is a view along a portion of line B-B' from FIG. 8A for one embodiment.
Figure 8C:
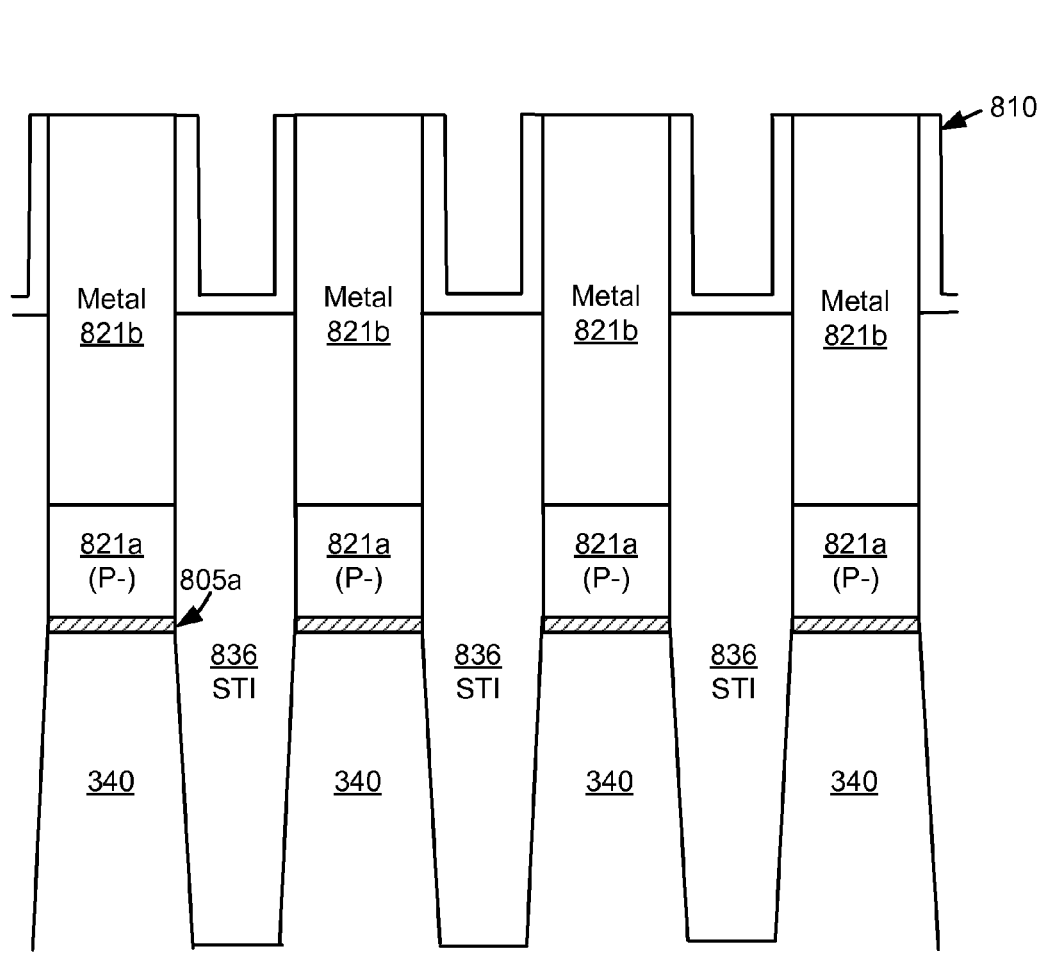
FIG. 8C is a view along line C-C' from FIG. 8A.

FIG. 8A depicts one embodiment of non-volatile storage elements and transistors. FIG. 8A is a view along a portion of a NAND string. Portions of two non-volatile storage elements on a NAND string and a select gate of that NAND string may be seen. FIG. 8A also shows a transistor in a peripheral region. FIG. 8A omits elements that are between the NAND string and the peripheral transistor. Note that the view along the NAND string corresponds to a portion of line A-A' of FIG. 2B. FIG. 8B is a view along line B-B' from FIG. 8A. FIG. 8B shows several non-volatile storage elements on adjacent NAND strings. FIG. 8C is a view along line C-C' from FIG. 8A. FIG. 8C shows several select gate transistors on adjacent NAND strings.

In FIGS. 8A and 8B, the non-volatile storage elements have a floating gate (FG) 811 with a P– semiconductor region 804 and a metal region 808. The p– region 804 resides over a tunnel oxide 805a.

Each non-volatile storage element has a control gate 812 and an inter-gate dielectric 810 between the floating gate 811 and control gate 812. The control gate 812 may be formed from doped polysilicon, from metal, or a combination thereof.

Referring now to FIG. 8A, the substrate 340 has source/drain regions (S/D), which connect the non-volatile storage elements to form a NAND string. Channel region 807 exists in the substrate 340 between the source/drain regions. Thus, channel region 807 is below the floating gate 811. More precisely, the channel region 807 is below the portion of the tunnel oxide 805 that is below the p– region 804 of the floating gate 811. Note that having the p– region 804 near the channel 807 may provide for good data retention. Moreover, erase operation is not necessarily harmed significantly by the p– region 804.

Referring now to FIG. 8B, the control gate 812 may wrap around the upper portion of the floating gate 811. For example, the control gate 812 may be over the top and around at least a portion of the sides of the floating gate 811. Thus, the metal region 808 is near the control gate 812. Stated another way, the metal region 808 borders substantial portions of the inter-gate dielectric 810 that separate the control gate 812 from the floating gate 811. It is not required that the metal region 808 border every portion of the inter-gate dielectric 810 that separates the control gate 812 from the floating gate 811. Note that having the metal region 808 near the control gate 812 may lead to a good capacitive coupling ratio between the control gate and floating gate during programming and also during erase operation.

Still referring to FIG. 8B, shallow trench isolation (STI) structures 836 in the substrate 340 electrically isolates NAND strings. For example, the STI structures 836 may provide electrical isolation between source/drain regions and channels 807 of adjacent NAND strings. In this example, the STI structures 836 extend part way up the sides of the metal regions 808. Note that the STI structures 836 might extend to a different height. For example, the STI structures 836 could extend higher or lower than depicted in FIG. 8B. In this example, a portion of the inter-gate dielectric 810 resides over the STI structures 836.

Referring back to FIG. 8A, transistors will now be discussed. The following may apply both to the select gate transistor at the end of NAND string and to the peripheral transistor. For purposes of discussion, the transistor gate 813 includes several conductive regions (821a, 821b, 821c). In this embodiment, the gate of a transistor has a p– region 821a, a metal region 821b, and an upper-most region 821c, which may be N+, P+, or metal.

Referring now to upper portions of the transistor gate 813, a small amount of inter-gate dielectric 810 may remain in the transistor gate as a result of the fabrication process. However, the inter-gate dielectric 810 is not required. Note that, in some embodiments, at least some of the inter-gate dielectric 810 is etched away in regions where transistors are formed.

Also note that the very upper portion 821c of the transistor gate 813 may be formed from material that was deposited to form the memory cell control gates 812. In some embodiments, the control gates 812 are formed from N+ polysilicon. Therefore, the very upper portions 821c of transistor gates may be formed from N+ polysilicon. In some embodiments, the control gates 812 are formed from P+ polysilicon. Therefore, the very upper portions 821c of transistor gates may be formed from P+ polysilicon. However, at least a portion of the control gates 812 may alternatively be formed from metal. In this alternative, the very upper portion 821c of the transistor gate may be formed from metal.

Finally, note that the gate oxide 805b in the peripheral region may be thicker, the same thickness, or thinner than the tunnel oxide 805a in the memory array region. In some embodiments, the gate oxide 805b is different thicknesses in different regions of the periphery. This may allow for regions of high-, medium-, and low-voltage transistors, for example.

FIG. 8C depicts four select gate transistors on different NAND strings. FIG. 8C is a view along line C-C' of FIG. 8A. The gate of each transistor includes a lower region 821a, N+ region 821b, and very upper region 821c. These regions have already been discussed in connection with the discussion of FIG. 8A. As noted, the lower region 821a are P– in this embodiment. As can be seen, the inter-gate dielectric 810 has been etched back such that region 821c may have good electrical contact to metal region 821b. Some of the inter-gate dielectric 810 may remain. Note that etching back the inter-gate dielectric 810 may reduce the height of the metal region 821b relative to the metal region 808 in the floating gates.

Note that although the p– region 804 may be desirable for lower portions of the floating gate 811, it may not be desirable to have a p− region in the gates of transistors. This may apply for both select gate transistors, as well as transistors in the peripheral region of the memory array. However, note that the transistor gates may be formed using similar materials used to form the floating gate stacks. For example, after initial deposition steps, the region in which transistor gates will be formed may be a p− region.

Figure 8D:
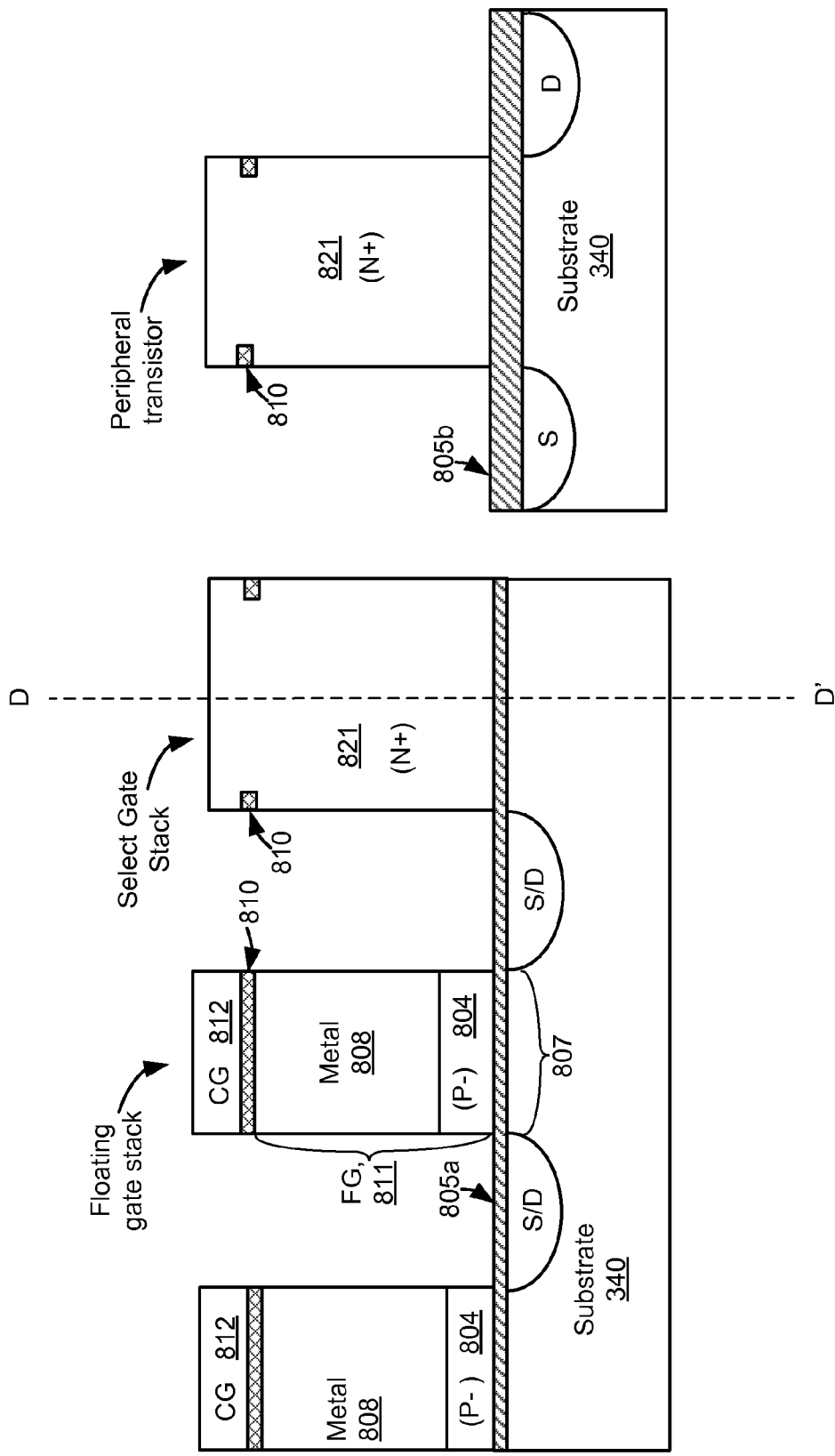
FIG. 8D depicts one embodiment in which the transistor gates are mostly N+ polysilicon.
Figure 8E:
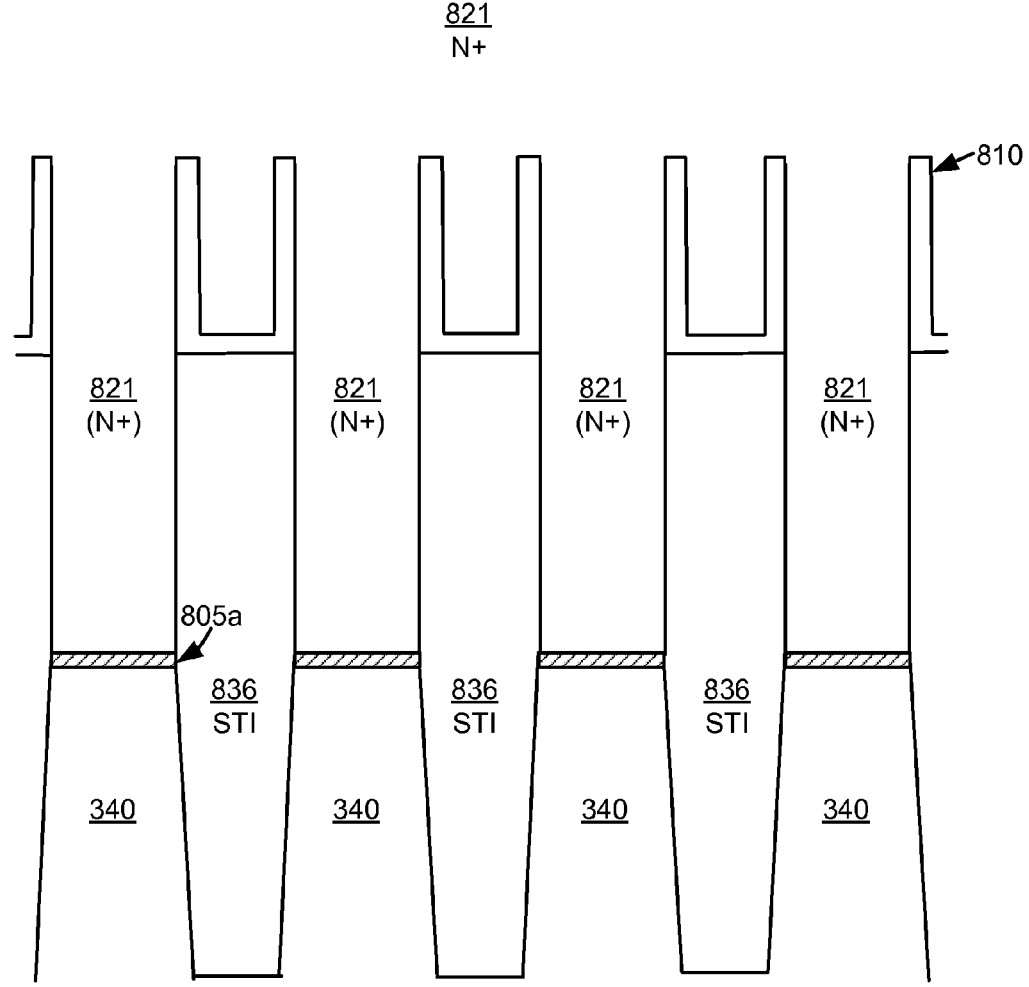
FIG. 8E depicts a view along line D-D' from FIG. 8D.

In one embodiment, the transistor gates are mostly (or all) polysilicon. For example, the transistor gates are mostly (or all) N+ polysilicon. Referring now to FIG. 8D, both the select gate and the peripheral transistors are mostly N+ polysilicon. There may be some residual inter-gate dielectric 810. FIG. 8E depicts a view along line D-D' from FIG. 8D. FIG. 8E depicts several select transistors from adjacent NAND strings. Techniques are disclosed below for forming transistors without a p− region in the same process as forming memory cells having a p− region. Note that although the transistor gate is depicted as one continuous N+ region in FIGS. 8D-8E, the gate may be formed in several distinct steps. For example, a lower, middle and upper portion of the transistor gate may be formed as a result of different deposition steps.

Figure 8F:
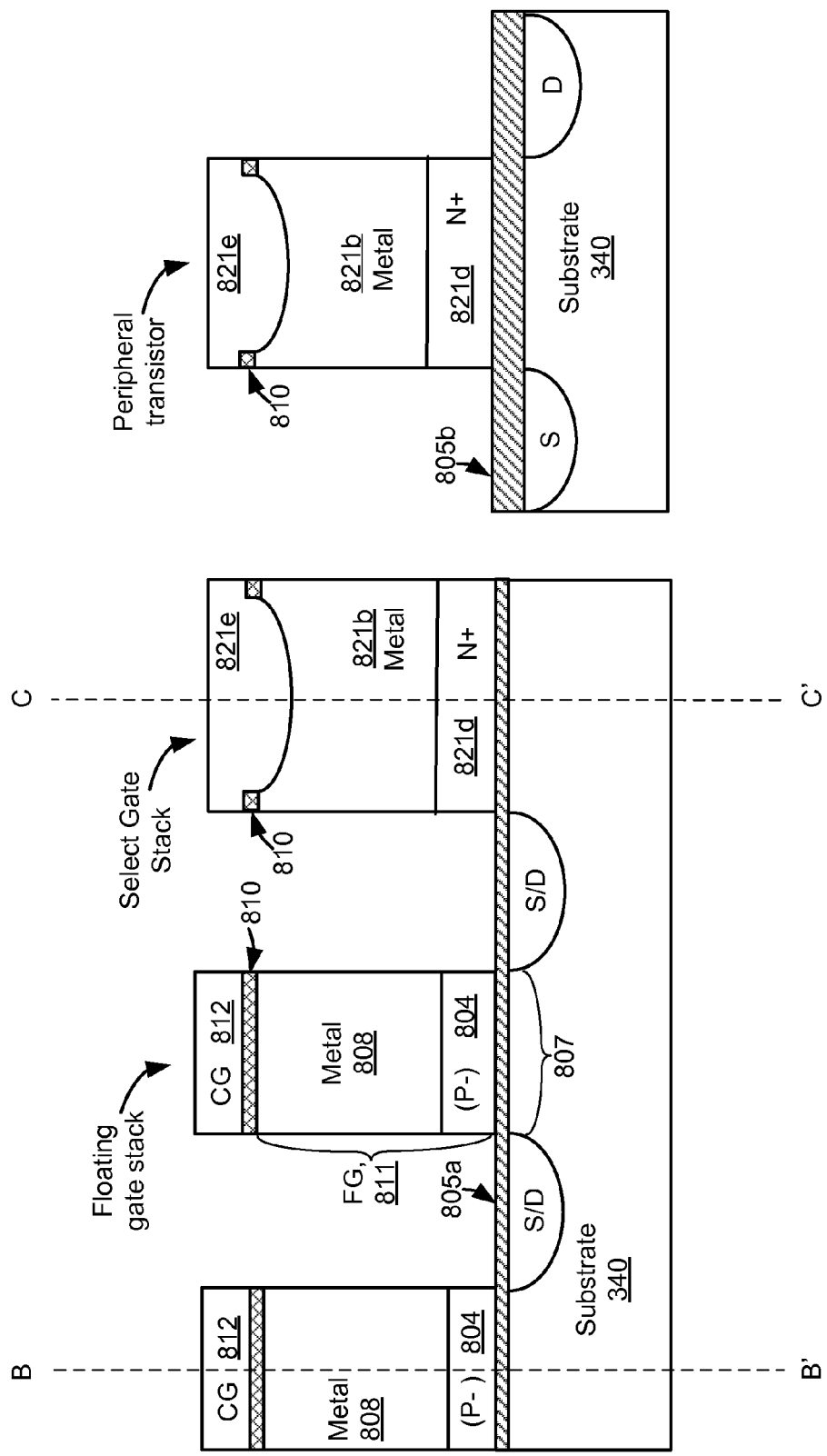
FIG. 8F depicts one embodiment in which transistor gates have a metal region at the top and an N+ region at the bottom.

In one embodiment, the lower portion of transistor gates are N+ and upper portion is metal. FIG. 8F shows that the transistor gates have a metal region 821*e* at the top and an N+ region 821*d* at the bottom. The middle portion 821*b* is also metal. The transistors may be fabricated during the same process as the memory cells. Note that region 821*e* may be formed from the same material used to form upper portions of the control gates 812. Therefore, at least the upper portions of control gates 812 may be metal, in this embodiment. Note that another option is for the uppermost region 821*e* to be doped polysilicon.

Figure 9A:
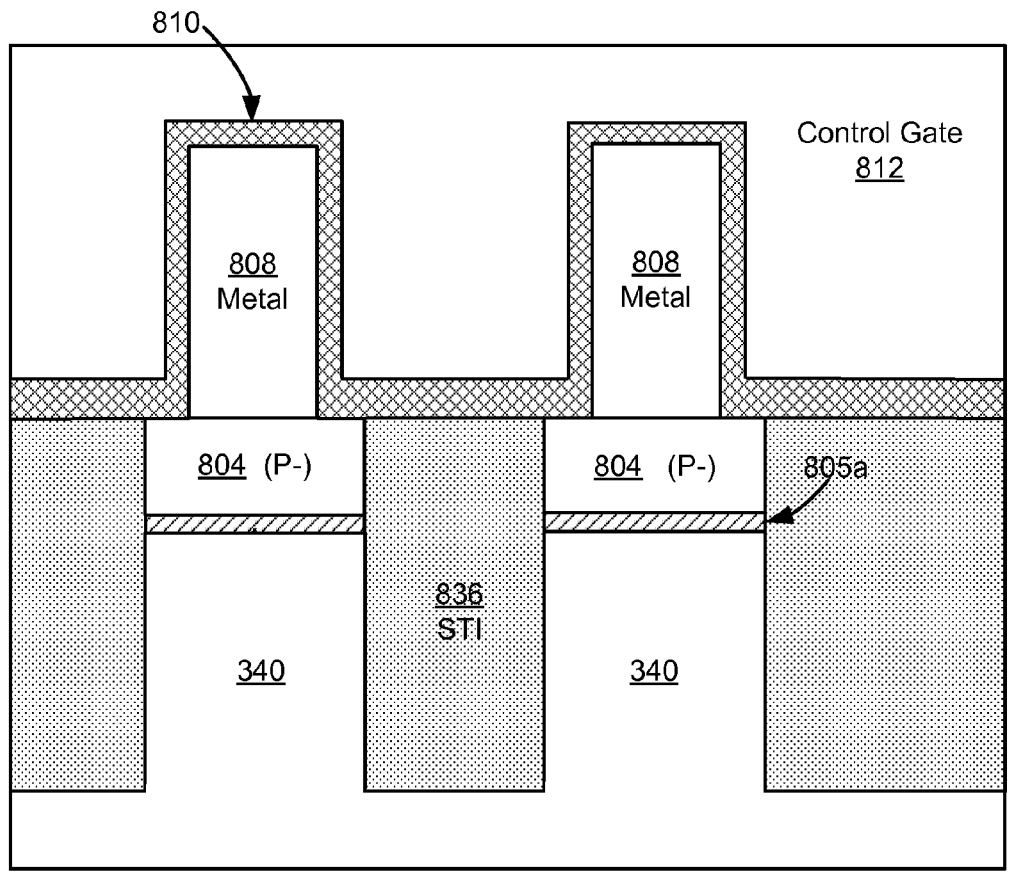
FIG. 9A depicts one embodiment in which the floating gates have an inverted T-shape.

Note that the floating gates could have a different shape. FIG. 9A depicts one embodiment in which the floating gates 811 have an inverted T-shape. FIG. 9A depicts two memory cells on adjacent NAND strings. The view is along line B-B' from FIG. 8A. Note that the view along the NAND string for this embodiment could appear similar to the embodiment of FIG. 8A.

In one embodiment, the transistor gates are N+ at the bottom and N+ in the middle; however, floating gates are p− at the bottom and metal in the top of the floating gate. Referring to the embodiment of FIG. 8G, the transistor gates 813 have n+ region 821*a*, etch stop layer 819, N+ region 821*f*, and uppermost region 821*g*. The uppermost region 821*g* could be formed from a variety of materials including doped polysilicon (for example, N+) and metal. The etch stop layer 819 may be a thin barrier (e.g., an insulator or dielectric that is a few Angstroms thick). This etch stop layer 819 may serve as an etch stop layer during processing, while ensuring the n+ region 821*a* and the N+ region 821*f* are not electrically insulated from each other. The etch stop layer 819 in the floating gates is of suitable material and thickness such that p− region 804 and the metal region 808 are not electrically insulated from each other.

Referring now to FIG. 9A, the floating gate 811 has a base (or lower portion) and a stem (or upper portion). In this embodiment, the p− region 804 is in the base and the metal region 808 is in the stem. The p− region 804 could extend into the stem, or the metal region 808 could extend into the base.

In this example, the control gate 812 wraps around the upper portion of the floating gate. For example, the control gate 812 is over the top and around at least a portion of the sides of the floating gate 811. Thus, the metal region 808 is near the control gate 812. Stated another way, the metal region 808 borders substantial portions of the inter-gate dielectric 810 that separate the control gate 812 from the floating gate 811. It is not required that the metal region 808 border every portion of the inter-gate dielectric 810 that separates the control gate 812 from the floating gate 811. Note that having the metal region 808 near the control gate 812 may lead to a good capacitive coupling ratio between the control gate and floating gate during programming and also during erase.

Still referring to FIG. 9A, shallow trench isolation (STI) 836 in the substrate 340 electrically isolates NAND strings. For example, the STI 836 may provide electrical isolation between source/drain regions and channels 807 of adjacent NAND strings. In this example, the STI 836 extends up to the base of the floating gate 811. Note that the STI 836 might extend to a different height. For example, the STI 836 could extend higher or lower than depicted in FIG. 8B. In this example, a portion of the inter-gate dielectric 810 resides over the STI 836.

Figure 9B:
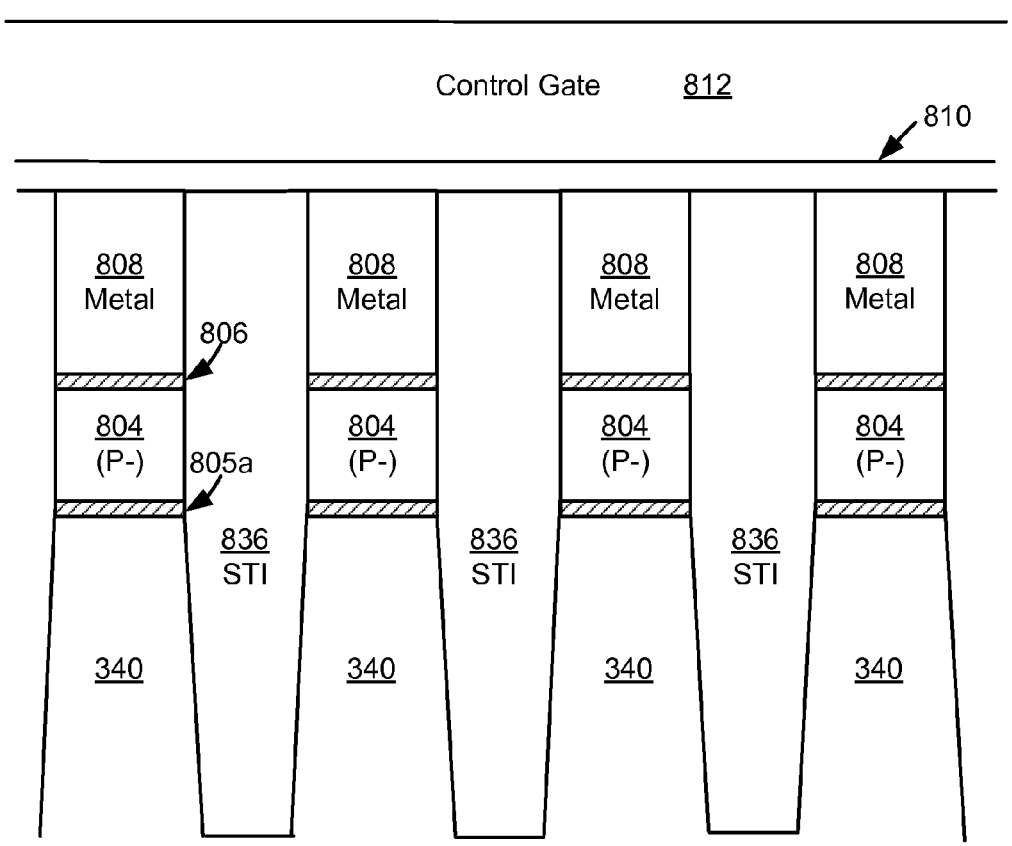
FIG. 9B shows a perspective for one embodiment along line B-B' of FIG. 8A.

One embodiment is what may be referred to as a "flat cell." In this embodiment, the control gate 812 does not wrap around sides of the floating gate 811. FIG. 9B shows a perspective for one embodiment along line B-B' of FIG. 8A. As can be seen in FIG. 9B, the control gate 812 does not wrap around the sides of the floating gate 811. In this embodiment, the inter-gate dielectric 810 does not wrap around the sides of the floating gate 811 either. The floating gate 811 has a P− region 804 bordering the tunnel oxide 805*a*, and a metal region 808 bordering the inter-gate dielectric 810 between the floating gate 811 and control gate 812. Referring back to FIG. 8A, the control gate 812 does not wrap around the floating gate 811 from this perspective either.

Example Band Diagrams

Figure 11A:
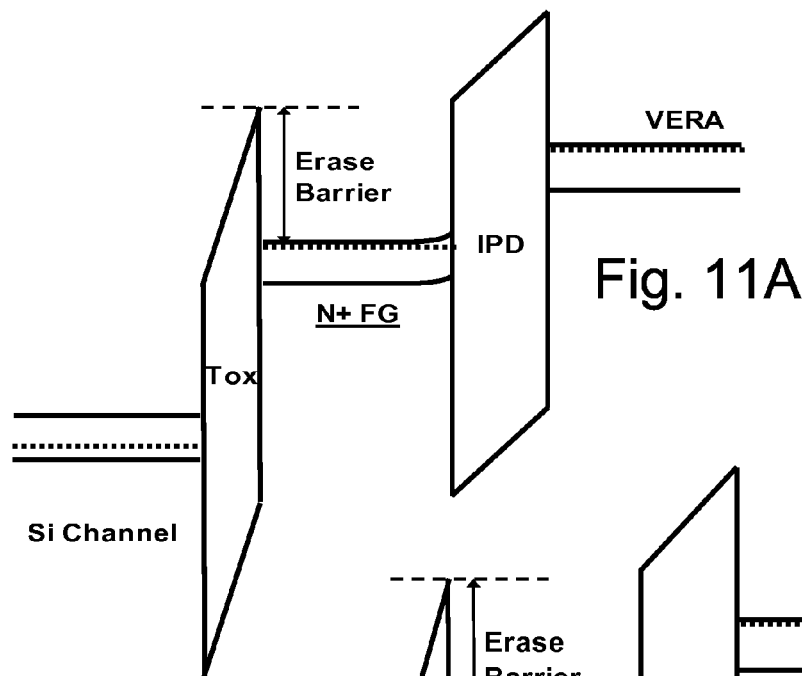
Figure 11B:
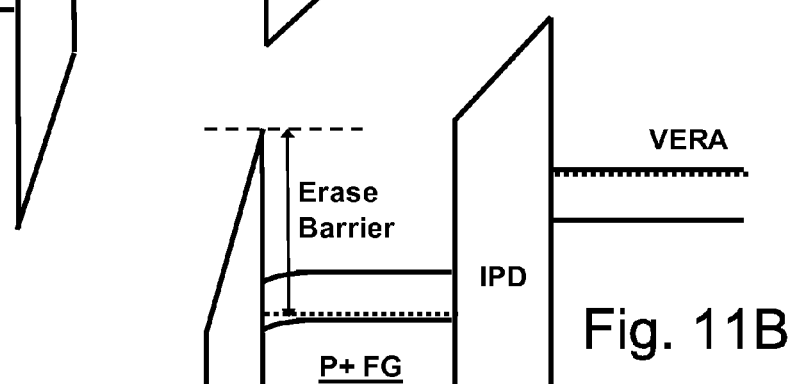
Figure 11C:
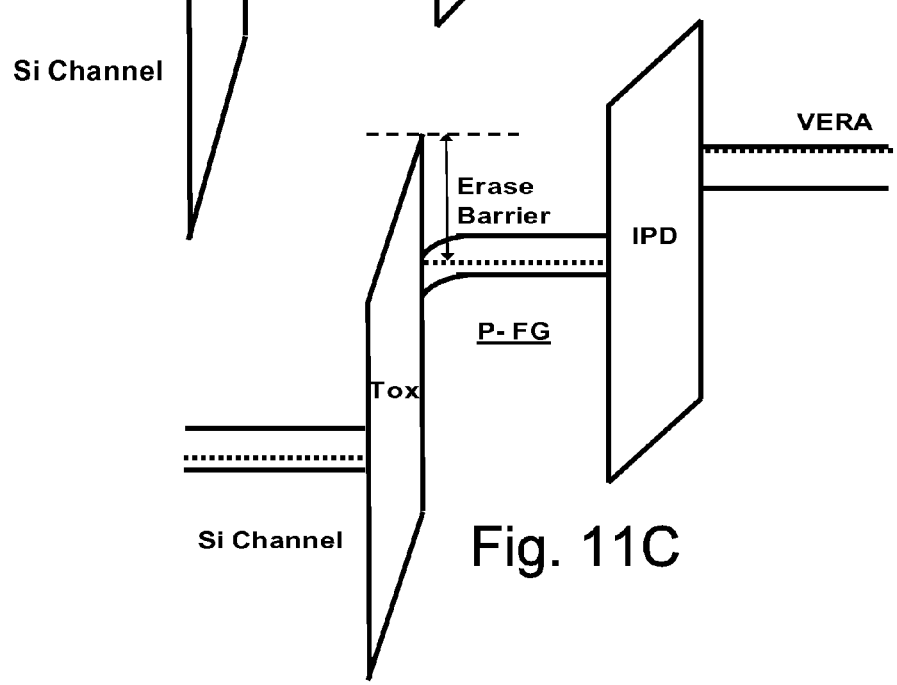
Figure 12A:
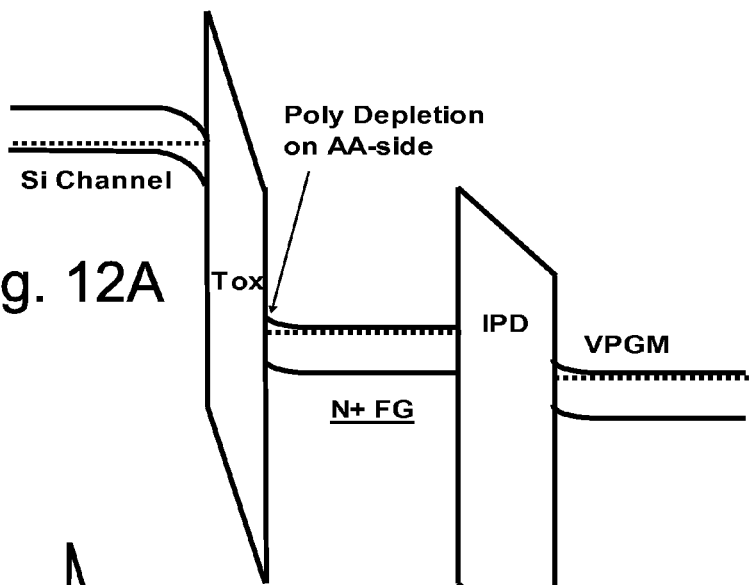
Figure 12B:
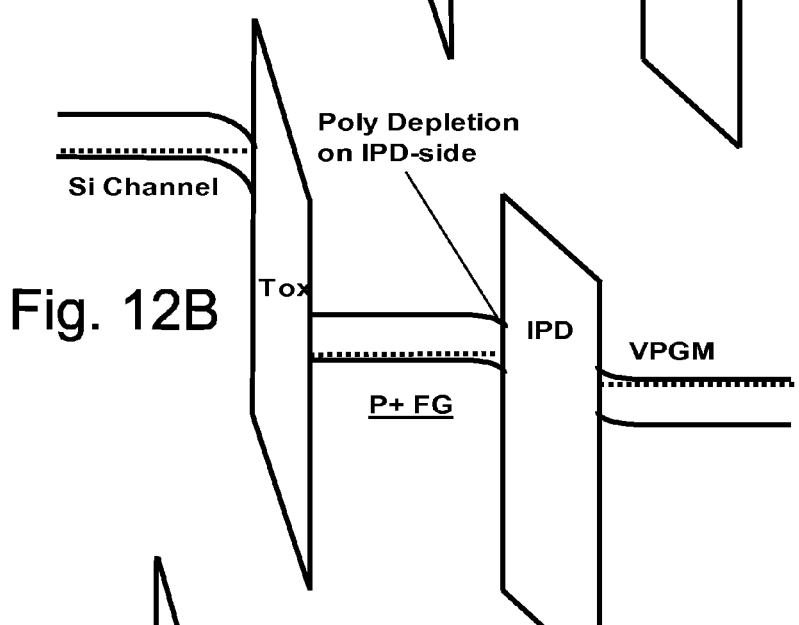
Figure 12C:
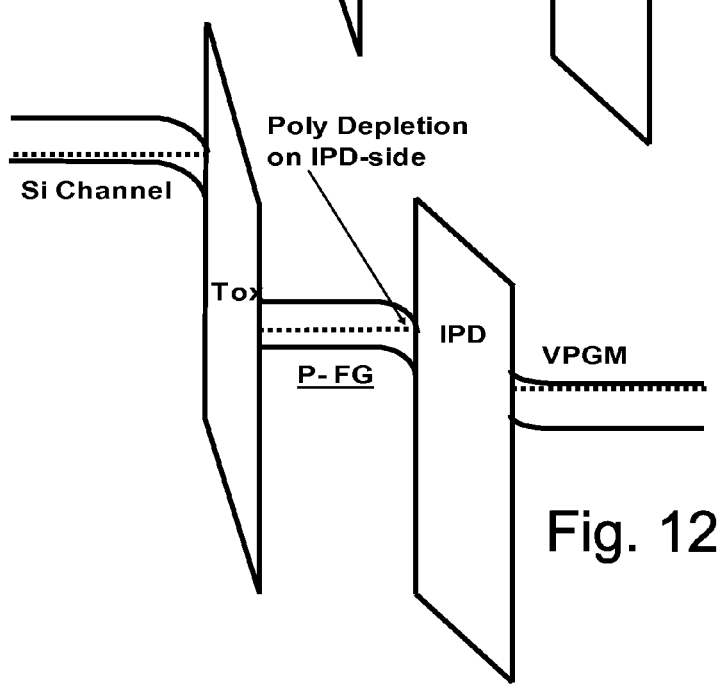
Figure 13A:
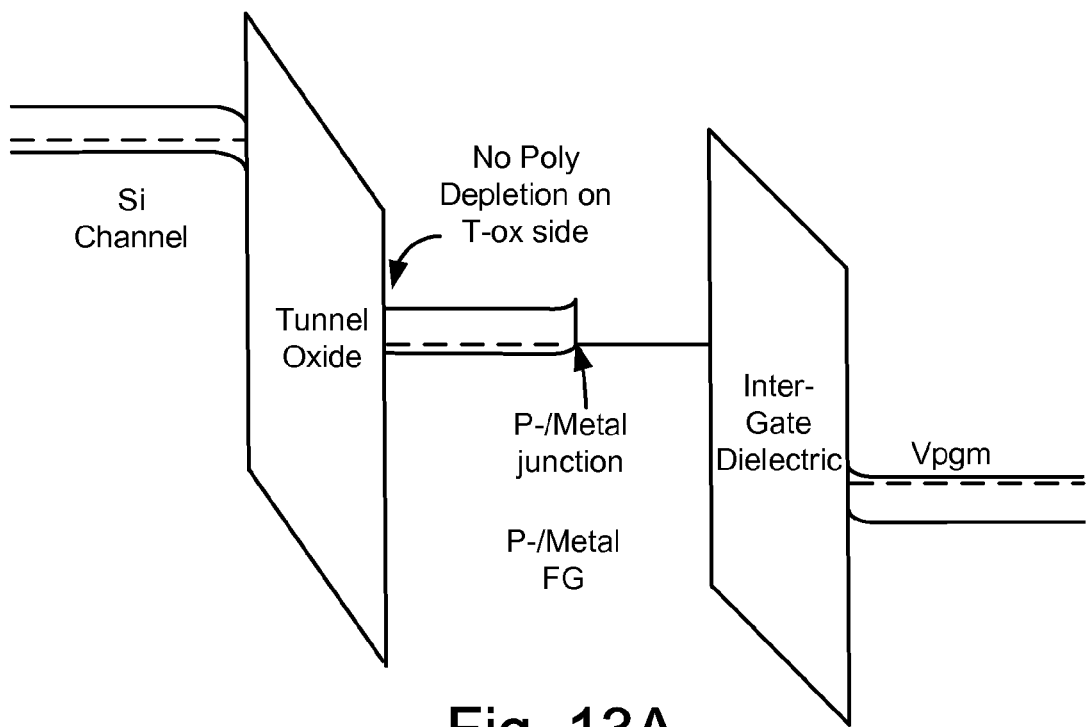
FIGS. 13A-13C depict band diagrams for embodiments of memory cells having P-/Metal floating gates.
Figure 13B:
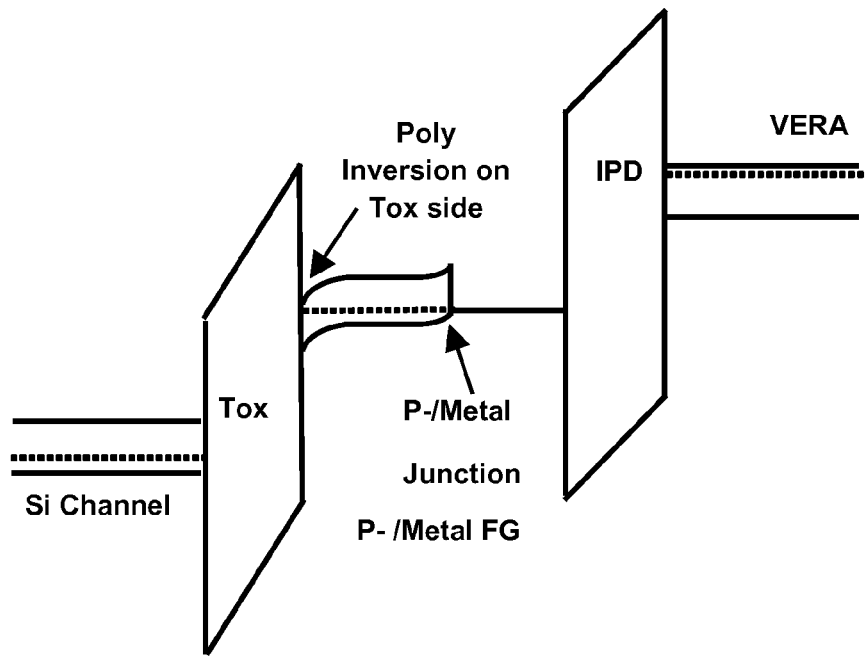
Figure 13C:
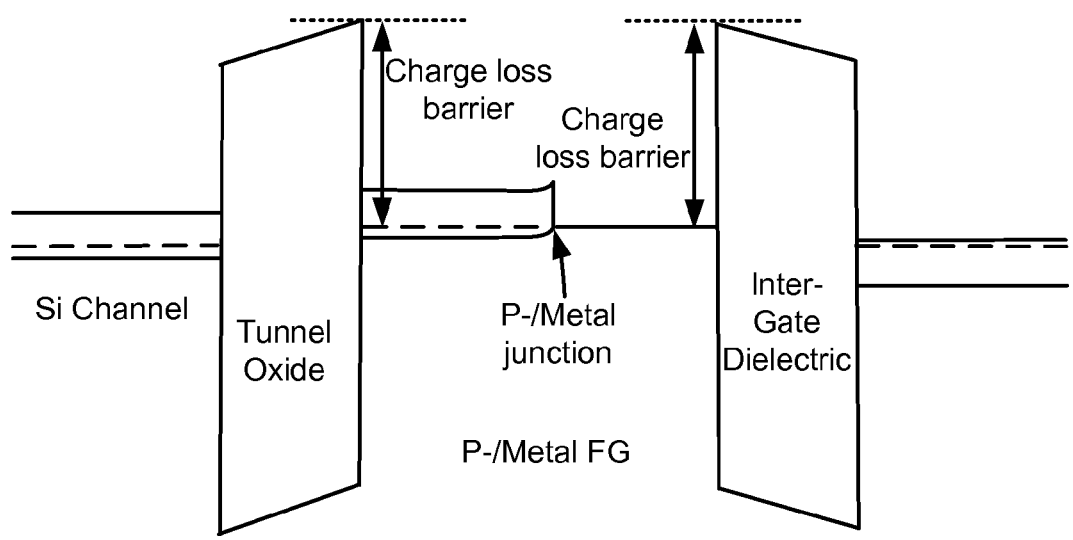

FIGS. 10A-13C depict energy band diagrams. FIGS. 10A-12C cover cases in which the floating gate is formed entirely from one conductivity. FIGS. 13A-13C correspond to embodiments having a floating gate (FG) that has a P− region and a metal region. Note that the band diagrams in FIGS. 10A-12C are useful for purposes of discussion of P−/metal floating gates.

Figure 10A:
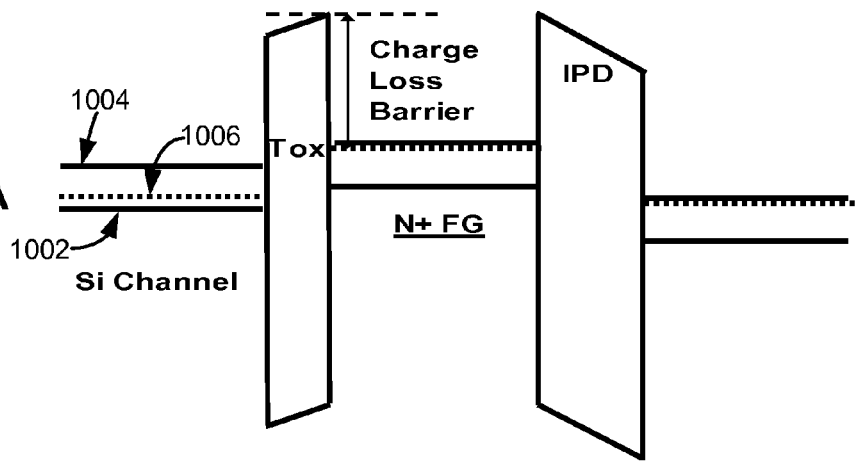
FIGS. 10A, 10B, 10C, 11A, 11B, 11C, 12A, 12B, 12C depict energy band diagrams.
Figure 10B:
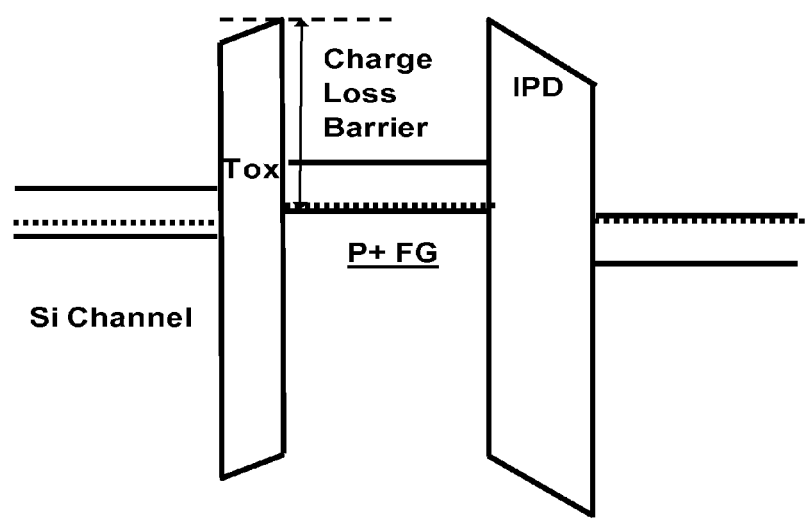
Figure 10C:
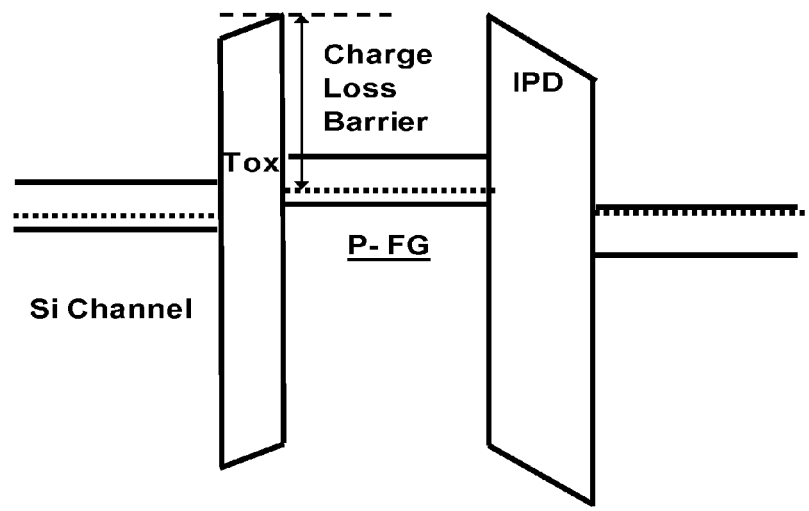

FIG. 10A is for an N+FG. FIG. 10B is for a P+FG. FIG. 10C is for a P− FG. FIGS. 10A-10C will be used to discuss data retention. Referring to FIG. 10A, five distinct regions are depicted from left to right. These regions correspond to a silicon channel, a tunnel oxide, an N+ floating gate, an inter-gate dielectric, and a control gate. FIGS. 10B and 10C diagrams have a similar organization, but are for different floating gate materials.

Conduction bands 1002 and valence bands 1004 for silicon regions are shown as solid lines. The Fermi levels 1006 are depicted as dashed lines. A charge loss barrier is depicted as the difference between the Fermi level 1006 of the FG and the conduction band of the tunnel oxide. As can be seen, the P+FG of FIG. 10A offers higher barrier to electrons than the N+FG of FIG. 10A, thus improving data retention. As one example in which the channel is silicon and the tunnel oxide is $SiO_2$, the electron barrier might be about 3.1 eV for an N+FG. However, for a P+FG the electron barrier might be about 4.2 eV. For a P− FG, the electron barrier could be about between about 3.65 eV and 4.2 eV, depending on the P− concentration, at least for some materials. Note that for some embodiments, the tunnel oxide is thinner than the inter-gate dielectric. Under this scenario charge loss (e.g., data retention) could be a greater problem across the tunnel oxide than across the inter-gate dielectric.

As will be discussed below, having a P+ region in the FG near the tunnel oxide may also make the barrier to remove electrons during erase larger than having an N+ region in the FG near the tunnel oxide may. Therefore, a FG with such a P+ region may be harder to erase than a FG having an N+ region near the tunnel oxide. FIGS. 11A-11C will be used to discuss erase. FIG. 11A is for an N+FG. FIG. 11B is for a P+FG. FIG. 11C is for a P− FG. Each of these diagrams shows an erase voltage (VERA) applied to the control gate. Also depicted is an erase barrier, which is the difference between the Fermi level 1006 of the FG and the conduction band of the tunnel oxide. The erase barrier for the N+FG may be about 3.1 eV. The erase barrier for the P+FG may be about 4.2 eV. The erase barrier for the P− FG may be about 3.1V, at least for some P− concentrations. Note that with a different P− concentration, the erase barrier may be different.

Note that for the P− FG, there may be some inversion at the tunnel oxide interface. This inversion may help lower the erase barrier. For example, note that due to the inversion the erase barrier for P− FG may be less than the data retention barrier for P− FG. In contrast, for P+FG the erase barrier may be about the same as the data retention barrier for P+FG. Moreover, note that the erase barrier of the P− FG compares favorably to the erase barrier for the P+FG. That is, during erase operation, it may be desirable to have a low barrier to electrons for efficient erase operation.

FIGS. 12A-12C are band diagrams illustrating programming characteristics of N+FG, P+FG, and P− FG, respectively. A program voltage, VPGM, is applied to the control gate. For N+FG of FIG. 12A, poly-depletion may occur during programming in the FG close to tunnel oxide interface.

For P+ or for P− FG of FIGS. 12B and 12C, poly-depletion may occur in the FG close to inter-gate dielectric interface, which may result in lower coupling ratio. However, having a metal region near the inter-gate dielectric may improve the coupling ratio relative to either a P+ or P− region. Therefore, a FG having metal near the inter-gate dielectric may program more efficiently than a FG having a P-type semiconductor near the inter-gate dielectric.

In one embodiment, the FG is P− near the tunnel oxide and metal near the control gate. This may achieve good data retention, efficient erase, and efficient programming. A P− region bordering the tunnel oxide may have better data retention than N+FG due to increased electron barrier at the tunnel oxide interface. Erase operation for a FG having a p− region near the tunnel oxide may be efficient due to inversion at the p− doped FG at the tunnel oxide interface. For example, the erase operation may be more efficient than a FG having a p+ region near the tunnel oxide. The coupling ratio during programming of a FG having a metal region near the control gate (e.g., bordering the inter-gate dielectric) may be better than a FG with a P-type semiconductor near the control gate. The coupling ratio during erase of a FG having a metal region near the control gate (e.g., bordering the inter-gate dielectric) may be better than a FG with an N-type semiconductor near the control gate.

FIGS. 13A-13B are band diagrams illustrating programming and erase characteristics of memory cell having a FG that has a p− region bordering the tunnel oxide and a metal region bordering the inter-gate dielectric.

FIG. 13A depicts a band diagram under programming for one embodiment. As can be seen, there is no polysilicon depletion at either the tunnel oxide interface or the inter-gate dielectric interface. Therefore, the coupling ratio between the control gate and floating gate may be good. Consequently, an embodiment having a P−/metal floating gate programs efficiently. Moreover, with a high work-function metal, there may be less program saturation due to an increase in the barrier height at the inter-gate dielectric.

FIG. 13B depicts a band diagram under erase for one embodiment. There is inversion at the FG to tunnel oxide interface, due to the FG being P− at this interface. Therefore, the electron barrier during erase may be better (e.g., less) than P+FG and comparable to N+FG. Moreover, due to metal at inter-gate dielectric interface, there is no poly-depletion at this interface unlike N+FG. Consequently, an embodiment having a P−/Metal floating gate erases efficiently.

FIG. 13C depicts a band diagram for one embodiment to demonstrate improvements in data retention. There may be improvements for the both the tunnel oxide side and the inter-gate dielectric side of the floating gate. Because the FG is P− near the tunnel oxide, data retention may be better than if the FG is N+ near the tunnel oxide. Moreover, data retention may be almost as good as the case in which the FG is P+ near the tunnel oxide. Stated another way, the charge loss barrier at the FG to tunnel oxide interface may be relatively large. Also, the charge loss barrier at the metal FG to inter-gate dielectric may be relatively large compared to floating gates of other materials. For example, referring back to FIG. 10A, the charge loss barrier at the IPD interface is relatively low for an N+FG. Therefore, embodiments having a P−/metal FG have good data retention at both interfaces of the FG.

Process Flows

As mentioned, embodiments include a P−/metal type of FG. Since the metal part of floating gate may susceptible to high temperature process, post metal floating gate formation processing may have low temperature latitude to control metal reaction and diffusion. For example, employing low temperature chemical vapor deposition (CVD) oxide process may be preferred to high temperature oxide (HTO) process. Also, the same process may be applied to the interface between the metal part of the FG and the inter-gate dielectric. Regarding the control gate, either a silicide control gate (N+ or P+ poly control gate) or metal gate can be applicable to this process. Furthermore, deposition of various materials (e.g., polysilicon for the control gates and inter-gate dielectric) is performed using a low thermal budget process, in some embodiments.

Several different process flows for P−Metal hybrid type floating gate are disclosed herein. In one embodiment, the process concludes with the transistors having a lower p− region (near the gate oxide). As noted herein, having a p− region near the gate may impact the threshold voltage. Thus, in other embodiments, the process concludes with the transistors not having a p− region. Thus, the threshold voltage of transistors may be tuned based on the process used. If desired, methods such as gate replacement technique to replace the "P−Metal" CMOS gates by "N+Metal" gates may be used.

Figure 14:
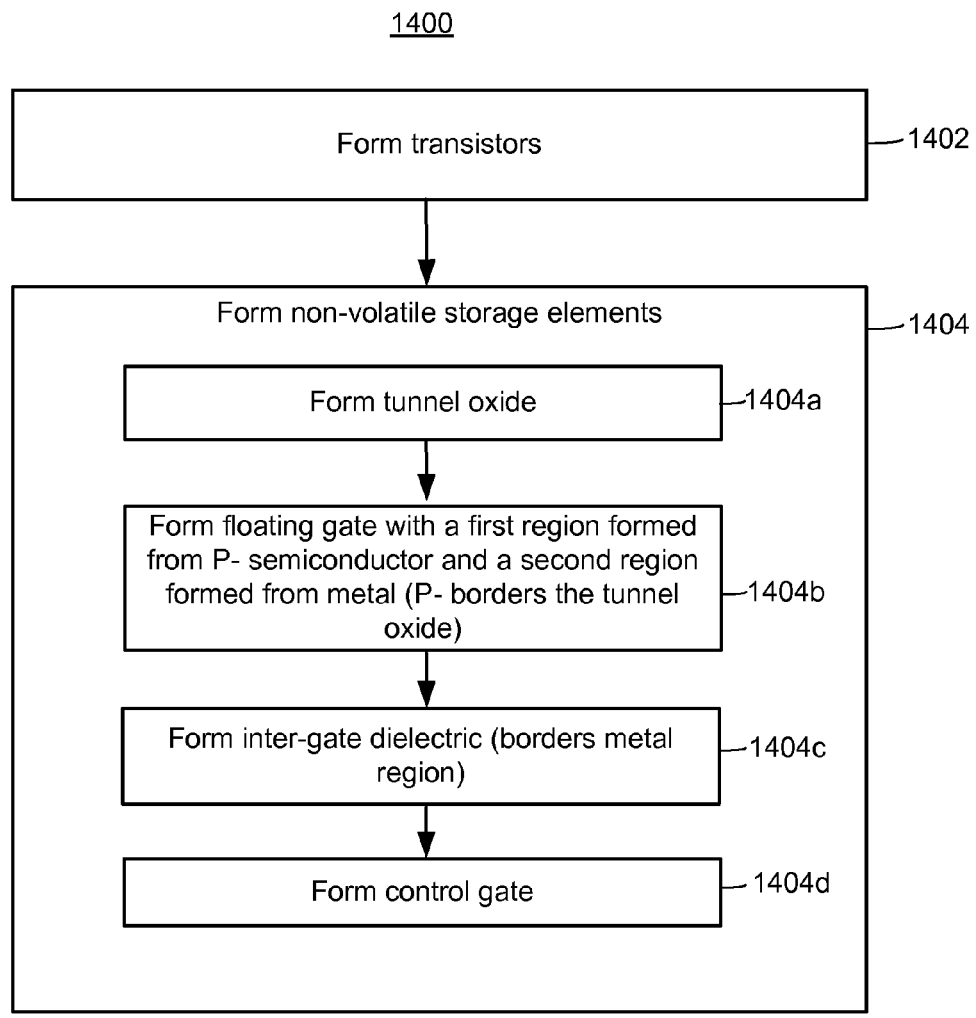
FIG. 14 is a flowchart of one embodiment of a process of forming a memory array with memory cells having P-/metal floating gates and transistors having P-/metal gates.

FIG. 14 is a flowchart of one embodiment of a process 1400 of forming a memory array with memory cells having P−/metal floating gates and transistors having P−/metal gates. Process 1400 may be used to form any of the memory cells and transistors shown and described in FIGS. 8A-9B, as well as other memory cells and transistors not specifically shown or described. Note that the steps are described in process 1400 in a certain sequence as a matter of convenience. The steps may occur in a different order.

In step 1402, transistors are formed. These may be formed in the memory array region (e.g., select transistors) or in a peripheral region. An individual transistor may include a gate 813 and a gate oxide 805*b*.

In step 1404, non-volatile storage elements are formed. Step 1404 may include several sub-steps. Sub-steps 1404*a*-1404*d* for forming a given storage element may be as follows. In step 1404*a*, a tunnel oxide 805*a* is formed over a region for a channel 807 in a substrate 340. In step 1404*b*, a floating gate 811 is formed over the tunnel oxide 805*a*. The floating gate 811 has a first region 804 formed from P− semiconductor and a second region 808 formed from metal. The first region 804 borders the tunnel oxide 804 over the channel region 807. In step 1404c, an inter-gate dielectric 810 is formed. The inter-gate dielectric 810 borders the metal region 808 of the floating gate 811. In step 1404d, a control gate 812 is formed. Note that the inter-gate dielectric 810 separates the floating gate 811 and the control gate 812.

Note that the doping concentration in the P− semiconductor region may be chosen to achieve a desired balance of various performance characteristics such as data retention and erase efficiency. A weak p-type doping level may provide better erase efficiency than a heavy p-type doping. However, data retention may improve when p-type doping is heavier. A suitable level of p-type doping may be selected to achieve desired erase efficiency, while also providing desired data retention. In one embodiment, the level of p-type doping is selected such that, at least during erase operation, there will be some inversion near the FG-to-tunnel oxide interface, which lowers the energy barrier such that electrons may cross the tunnel oxide more easily.

Figure 15A:
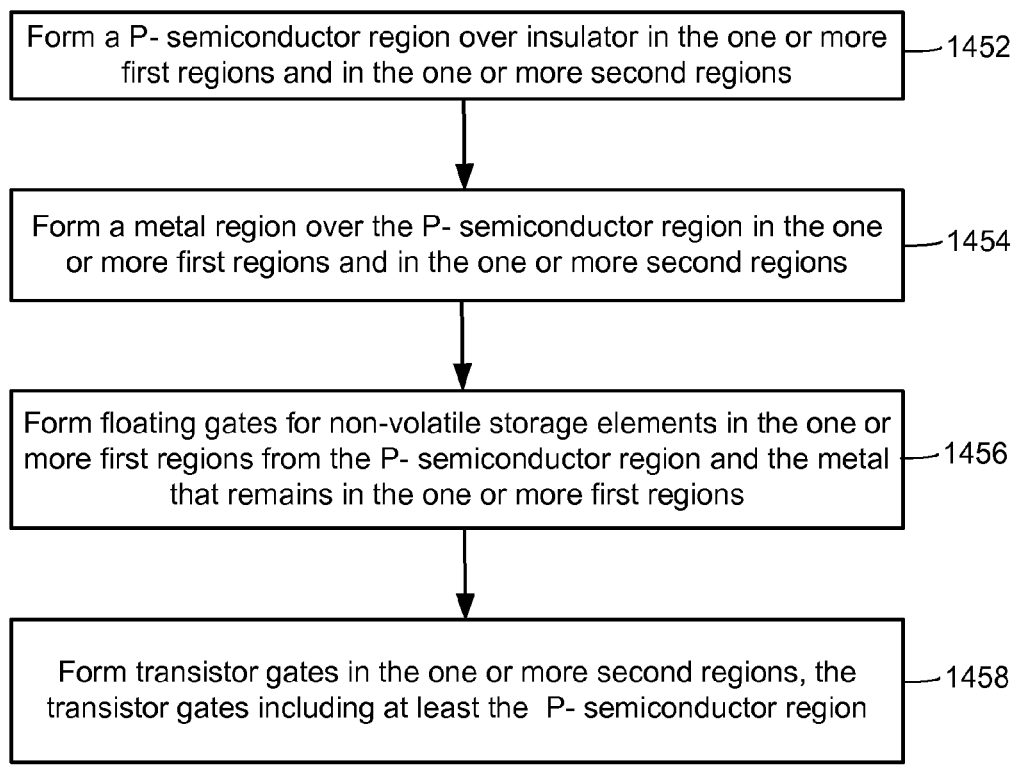
FIG. 15A is a flowchart one embodiment of a process of forming transistors and non-volatile storage elements in which the transistors are p- semiconductor near the gate oxide and metal away from the gate oxide.

FIG. 15A is a flowchart one embodiment of a process 1450 of forming transistors and non-volatile storage elements. Process 1450 is one embodiment of steps 1402 and 1404 from process 1400. In process 1450, the transistors are p− semiconductor near the gate oxide and metal away from the gate oxide. Process 1450 may be used to form non-volatile storage elements and transistors such as those depicted in FIGS. 8A-8C and 9A-9B, a well as others not specifically shown or described herein.

In step 1452, a P− semiconductor region is formed over an insulator in one or more first regions in which the non-volatile storage elements and in one or more second regions in which the transistors are to be formed. The P− semiconductor region will serve as a p-region 804 for floating gates and as a p-region 821a for transistor gates.

In step 1454, a metal region is formed over the P− semiconductor region in the one or more first regions and in the one or more second regions. The metal region will serve as a metal region 808 for floating gates and as a metal region 821b for transistor gates.

In step 1456, the floating gates for the non-volatile storage elements are formed in the one or more first regions from the P− semiconductor region and the metal region that remains in the one or more first regions. The insulator that was formed in step 1452 serves as the tunnel oxide 805a in a memory array region.

In step 1458, the transistor gates are formed in the one or more second regions. The transistor gates include at least the metal 821b and the P− semiconductor region 821a. The insulator that was formed in step 1452 serves as the gate oxide 805b in a peripheral region. Note that the transistor gates could also have an uppermost portion 821a formed from material used to form control gates of memory cells.

Figure 15B:
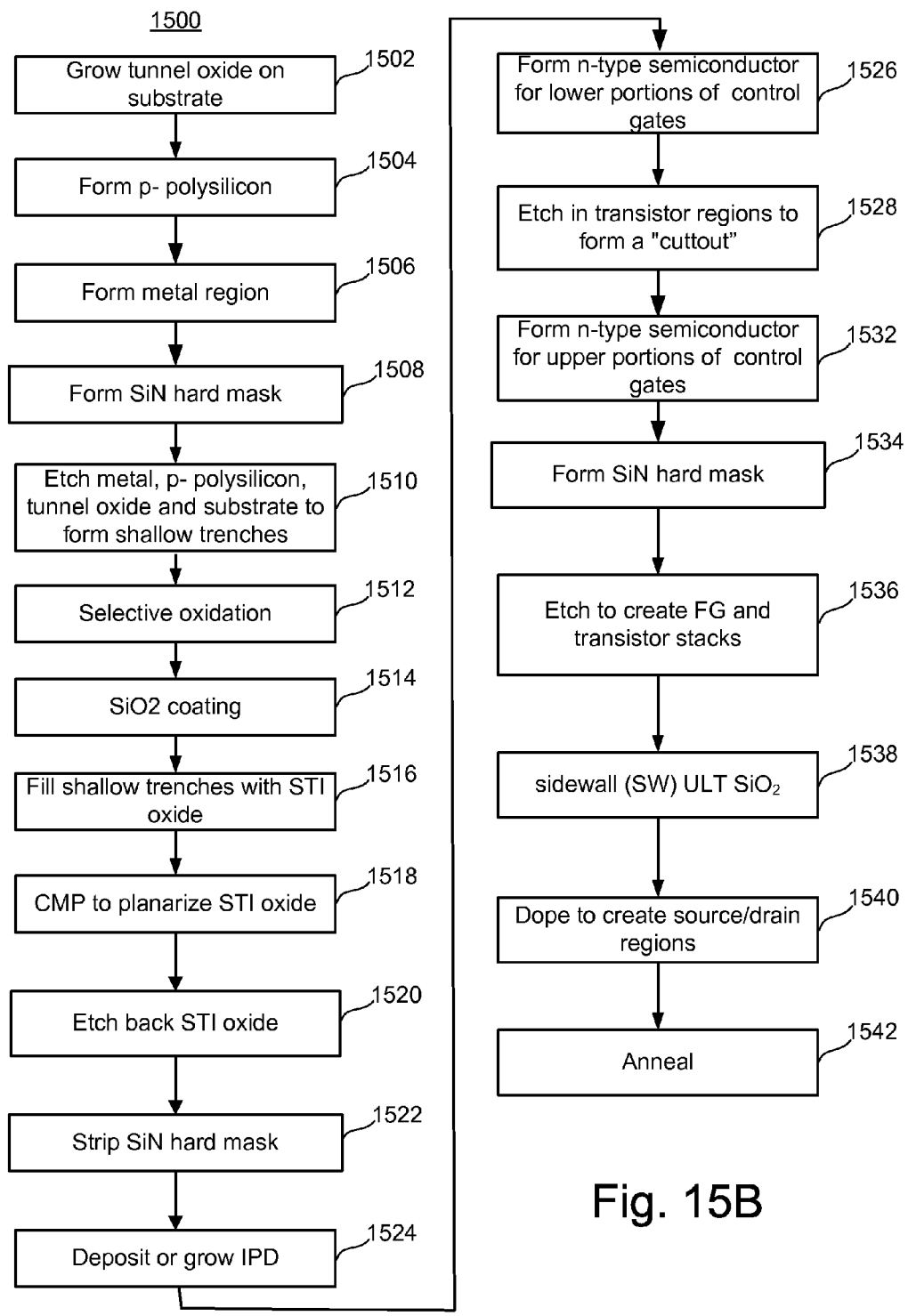
FIG. 15B depicts further details of one embodiment of a process for forming non-volatile storage elements and transistors in which the transistors are p- semiconductor near the gate oxide and metal away from the gate oxide.

FIG. 15B depicts one embodiment of a process 1500 for forming non-volatile storage elements and transistors. Process 1500 shows further details of one embodiment of process 1450 of FIG. 15A. FIG. 15B will be discussed with respect to FIGS. 16A-16E, which show results after various steps of process 1500. Note that the flowchart does not describe all implant steps, the gap fill of etched volumes between the floating gate stacks, or forming the contacts, metallizations, vias, and passivation, as well as other portions of the manufacturing process known in the art. There are many ways to manufacture memory according to embodiments and, thus, the inventors contemplate that various methods other than that described by FIG. 15B can be used. While a flash memory chip will include core memory and peripheral circuitry, the process steps of FIG. 15B are intended only to describe in general terms one possible process for the fabrication of portions of a memory array. For example, the floating gates can be formed to have many different shapes. In some embodiments, the floating gates have a relatively wide base with a relatively narrow stem above the base.

Step 1502 includes growing oxide material on top of a silicon substrate. The substrate may be etched in preparation for growing the tunnel oxide. The substrate may be etched to different levels, based on the thickness of tunnel oxide that is desired. Then, a tunnel (or gate) oxide layer may be grown over the substrate in both the memory array and peripheral region. Nitridation may be performed to improve gate oxide quality.

In step 1504, a p-type semiconductor is formed over the oxide layer. For example, a polysilicon layer that will be used to form the floating gates is deposited over the oxide material using CVD, PVD, ALD or another suitable method. Thus, the semiconductor may be silicon. This layer may be doped as deposited or doped after depositing. In one embodiment, this layer is a p− (also referred to as a weakly doped p-layer). As one example, the doping concentration may be $1.0 \times 10^{19}/cm^3$. However, the doping concentration could be lower or higher. An example impurity is boron.

In step 1506, a metal region may be formed over the p-type semiconductor. This layer may be for upper portions of floating gates, as well as for portions of transistor gates. FIG. 16A shows results after step 1506. FIG. 16A shows various layers in a region in which memory cells on several NAND strings are being formed and a region in which a peripheral transistor is being formed. The view may be along the line B-B' in FIG. 8A. FIG. 16A shows the results after initial steps to form a structure similar to the one of FIG. 8B, with a peripheral transistor also being formed. There is an oxide layer 1605a, 1605b over a substrate 340. Note that the oxide layer 1605b may be thicker in certain regions for the peripheral transistor (such as high voltage transistors), than the layer 1605a in the memory array (e.g., NAND string) region. Parts of the P− region 1604 will eventually become lower parts of floating gates, as well as lower parts of transistor gates. Metal region 1608 will be used for upper portions of floating gates, as well as a portion of transistor gates.

In step 1508, a SiN hard mask is formed over the metal region 1608 to allow etching to form STI structures. Forming the SiN mask may be performed as follows. First, SiN may be deposited over the entire metal region 1608 using, for example, CVD. Next, a photoresist layer may be added over the SiN. The photoresist may be exposed and developed to form a mask pattern. The pattern may be transferred to the SiN, thus forming the SiN hard mask.

In step 1510, shallow trench isolation trenches are formed based on the SiN hard mask. In step 1512, the metal region 1608, the p− polysilicon layer 1604, the tunnel oxide material 1605, and the top of the silicon substrate 340 may be etched. This may be achieved with reactive ion etching (RIE). In one embodiment, the etch is approximately 0.2 microns into the substrate 340 to create shallow trench isolation (STI) areas, where the bottom of the trenches are inside the top of the P-well. Forming the shallow trench isolation trenches also etches the polysilicon into strips that run in the direction of what will become NAND strings. Thus, the STI structures will separate adjacent NAND strings. After the etch, cleaning is done (e.g., a STI wet clean is performed).

Note that the etching to form STI trenches may cause some damage to the p-polysilicon 1604. In one embodiment, a step 1512 of selective oxidation (FG/AA) may be performed to remove damage that the etch may have caused to the polysilicon. However, it is desirable to not oxidize the metal 1608. Thus, this may be a selective oxidation (FG/AA). In step 1514, the structure may be encapsulated with, for example, $SiO_2$ to prevent further process damage. This may cover sidewalls of the metal and p– polysilicon.

In step 1516, the STI trenches are filled with isolation material such as TEOS (Tetraethyl orthosilicate), HDP (High Density Plasma), Polysilazane (PSZ), $SiO_2$ (or another suitable material) up to the top of the SiN hard mask using CVD, rapid ALD or another method. In step 1518, chemical mechanical polishing (CMP), or another suitable process, is used to polish the isolation material flat until reaching the SiN hard mask.

FIG. 16B depicts results after step 1518. FIG. 16B is the same orientation as FIG. 16A. FIG. 16B depicts STI structures 836 separating what will become memory cells on different NAND strings. Note that the floating gates are not yet completely formed. Later steps of process 1500 will discuss completing formation of the floating gates. Thus, the metal portions 1608' will eventually become metal regions 808 in floating gates. Oxide portions 1605a' will be used for the tunnel oxide 805a. The $SiO_2$ 1609 may be seen on the sidewalls of the substrate 340, the p-polysilicon 1604', and metal 1608'. As discussed, the $SiO_2$ 1609 may protect the metal 1608'. The SiN hard mask 1607 may be seen yet in place.

Step 1520 is etching back the STI isolation material. Step 1522 is removing the SiN hard mask. In step 1524, the inter-gate dielectric is grown or deposited. The inter-gate dielectric may include alternating conformal layers of oxide and nitride. For example, an Oxide Nitride Oxide (ONO) inter-poly dielectric is used. In one embodiment, the inter-gate dielectric comprises nitride-oxide-nitride-oxide-nitride.

In step 1526, a first layer of polysilicon (or another semiconductor) is formed for lower portions of control gates of memory cells (note that this may also used for transistor gates). In some embodiments, this is N+ semiconductor (either as deposited, or doped later).

In step 1528, etching is performed in transistor regions to form a "cuttout". This cuttout cuts through at least some of the inter-gate dielectric in the transistor regions. A control gate/IPD cuttout is made in regions in which control gates of transistors (e.g., select gate transistors) will be formed. The cuttouts may also be formed in regions where control gates of periphery transistors will be formed. A reason for these cuttouts is to form control gates that do not have the IPD forming a barrier. In other words, whereas memory cells have a floating gate that is separated from the control gate by the IPD, gates of transistors should not have a floating gate. Therefore, a portion of the IPD is removed where select gates and other transistors will be formed. FIGS. 16C-16D depict results after step 1528. FIG. 16C depicts results along the view similar to FIGS. 16A-16B. FIG. 16C shows a conformal layer of inter-gate dielectric 810 over the metal 1608' in the NAND string region. Over that is a polysilicon region 1612, which may be used for lower parts of control gates. Region 1612 may be N+ semiconductor. Note that a "cuttout" has been made at least through the inter-gate dielectric 810 where the peripheral transistor is being formed. It is acceptable for some inter-gate dielectric to remain in the transistor gate region. However, all of the inter-gate dielectric may be removed in the transistor gate region.

FIG. 16D shows initial formation of a part of a NAND string, but does not depict formation of a peripheral transistor. However, note that the NAND string has a select transistor at the end. FIG. 16D shows results along the view similar to FIG. 8A. FIG. 16D shows various layers of materials that have already been discussed. Note that from this view, the inter-gate dielectric 810 is a relatively flat layer, although this is not a requirement. A "cuttout" has been made at least through the inter-gate dielectric 810 in preparation for forming the gate of the select transistor. It is acceptable for some inter-gate dielectric 810 to remain in the transistor gate region. However, all of the inter-gate dielectric 810 may be removed in the transistor gate region. Note that in this embodiment, the etching of the cuttout does not etch into the metal region 1608'. In another embodiment, the etching of the cuttout may etch into the metal region 1608'.

In step 1532, a second layer of polysilicon (or another material) is formed for the control gates of memory cells (note that this is also used for transistor gates). In some embodiments, this is N-type (either as deposited, or doped later). In one embodiment, metal is formed instead of depositing a semiconductor in this step. Thus, the upper portions of control gates may be metal.

In step 1534, a mask layer may be formed over the second layer of polysilicon. A pattern is formed in the mask such that etching can later be performed to create floating gate stacks and control gates or transistors. In one embodiment, a SiN hard mask is patterned as follows. SiN may be deposited over the entire third layer of polysilicon using, for example, CVD. A photoresist layer may be added over the SiN. The photoresist may be exposed and developed to form a mask pattern. The pattern is transferred to the SiN, thus forming the SiN hard mask. Floating gate stacks and transistor stacks may be formed by etching based on the mask, in step 1536.

After etching, a sidewall (SW) ULT $SiO_2$ may be performed in step 1538 to prevent damage to the metal (and polysilicon). This may be a low temperature deposition (e.g., 300-500 C). The $SiO_2$ may be about 2 nm-10 nm, as examples. However, the $SiO_2$ could be thinner or thicker.

In step 1540, doping may be performed to create source/drain regions for memory cells, as well as a source and/or drain regions for transistors (e.g., select gate transistor, periphery transistors). The hard mask may remain in place while doping to create the source/drain regions. Later the hard mask may be removed. In step 1542, a thermal anneal is performed. This thermal anneal serves to diffuses the dopants that were implanted during step 1540. Note that other structures, such as resistors may be formed during the same process flow.

Figure 16E:
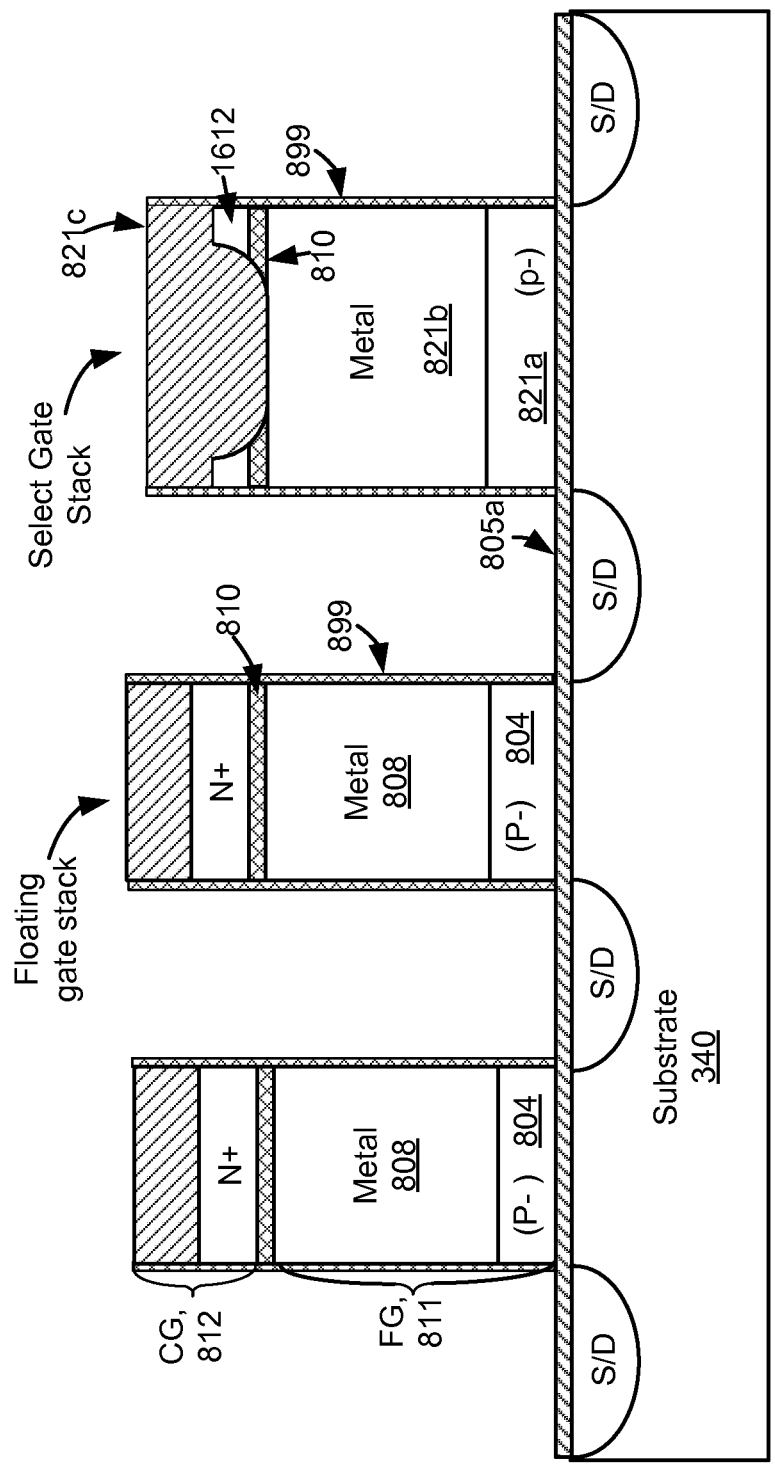

FIG. 16E depicts results after step 1540. FIG. 16E shows the view along the NAND string. Note that the diagram is not necessarily to scale. For example, source/drain regions of the transistors might be wider than for the memory cells. Likewise, the transistor gate might be wider than the width of floating gate stacks. Note that the $SiO_2$ that was added using ULT in step 1538 may be seen as layer 899 along the sidewalls of the floating gate stacks and the select gate stack. Transistor stacks in the peripheral region (not depicted in FIG. 16E) may also have a layer of $SiO_2$ on their sidewalls as a result of step 1538. Note that some residual inter-gate dielectric 810 and some residual of N+ layer 1612 are shown in the transistor gate. These are not required elements.

Figure 17A:
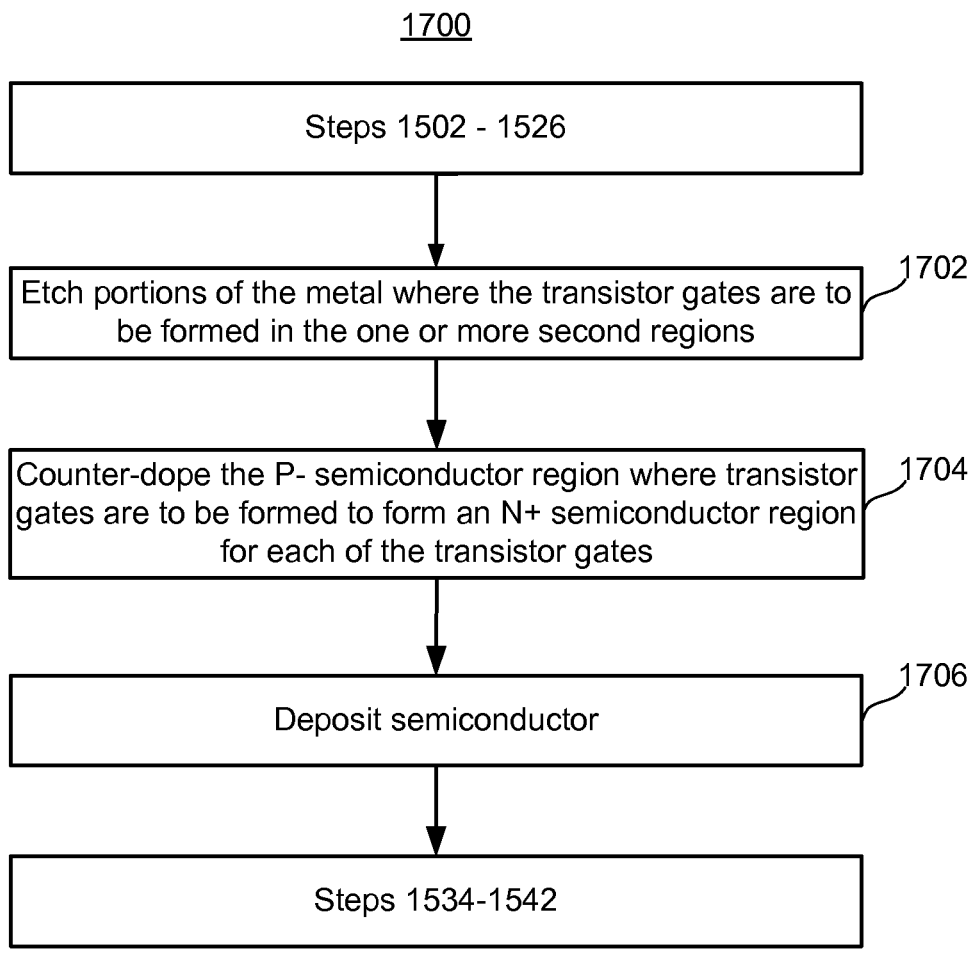
FIG. 17A is a flowchart one embodiment of a process of forming transistors and non-volatile storage elements in which the transistors are N+ semiconductor near the gate oxide and metal away from the gate oxide.

FIG. 17A depicts one embodiment of a process 1700 for forming non-volatile storage elements and transistors. Process 1700 is one embodiment of steps 1402 and 1404 from process 1400. In process 1700, metal that is initially deposited where transistors are being formed is removed, such that the transistors are N+ semiconductor. Process 1700 may be used to form non-volatile storage elements and transistors such as those depicted in FIG. 8D, as well as others not specifically shown or described herein.

Steps 1502-1526 are similar to process 1500. Included in these steps are forming a P– semiconductor region over an insulator in one or more first regions in which the non-volatile storage elements and in one or more second regions in which the transistors are to be formed. Moreover, a metal region is formed over the P− semiconductor region in the one or more first regions and in the one or more second regions. Further, an inter-gate dielectric is formed.

In step 1702, the inter-gate dielectric and the metal are etched in the regions where transistors are to be formed. Note that this etch may go all the way down to the p− polysilicon.

In step 1704, counter-doping is performed to change the p-polysilicon to n+ polysilicon in regions where transistor gates are to be formed. FIGS. 18A and 18B shows results of step 1704. FIGS. 18A-18B are similar in perspective to FIGS. 16C and 16D, respectively. FIG. 18A shows several memory cells being formed on different NAND strings and a transistor being formed in a peripheral region. FIG. 18B depicts a view along a NAND string. The cuttout region (with arrows) depicts a region in which a select gate transistor is being formed. The arrows represent the counter-doping. The portion of the transistor gate that is near the gate oxide 1605' has been changed to an N+ type region 1804.

After counter-doping, a semiconductor, such as silicon, may be deposited in step 1706. This silicon may be doped N+. Note that silicon may be formed in the etched away portions of the metal where the transistor gates are to be formed. Then, processing may be similar to steps 1534-1542 of process 1500. Results may be as depicted in FIG. 8D. In this example, most of the transistor gate is N+. Note that depending on how the cuttout was formed, there may not be any residual inter-gate dielectric in the transistor gates. However, note that if there is some residual intergate dielectric 810, there may also be some residual metal just below the dielectric 810. That is, the etching of the metal in step 1702 might not remove all of the metal below the residual intergate dielectric 810.

Figure 17B:
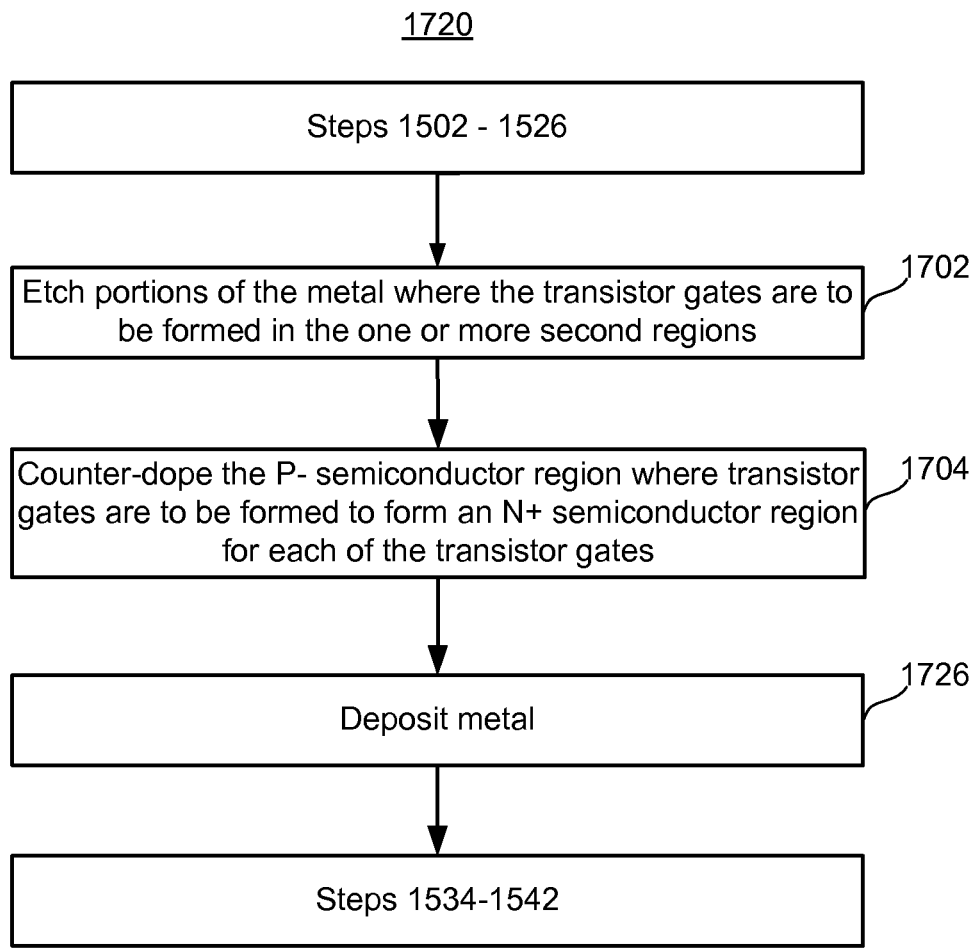
FIG. 17B depicts one embodiment of a process for forming memory array in which metal is used to fill the etched away portions of metal where transistor gates are to be formed.

In another embodiment, after the step of counter-doping (e.g., after step 1704 of FIG. 17A), rather than filling the etched away portions of the metal with polysilicon, metal is used to fill the etched away portions of the metal where transistor gates are to be formed. FIG. 17B depicts one embodiment of a process 1720 for forming memory array in accordance with this embodiment. Process 1720 is similar to process 1700, but has step 1726 of depositing metal rather than depositing silicon. Note that this metal may also be used for at least a portion of the control gates of memory cells. Results may be as depicted in FIG. 8F. Note that the transistor gate is N+ 821d at the very bottom. As noted above, this N+ region 821d may have been formed by counter-doping the p− region that was used for the floating gates. However, the rest of the transistor gate may be metal.

Figure 19:
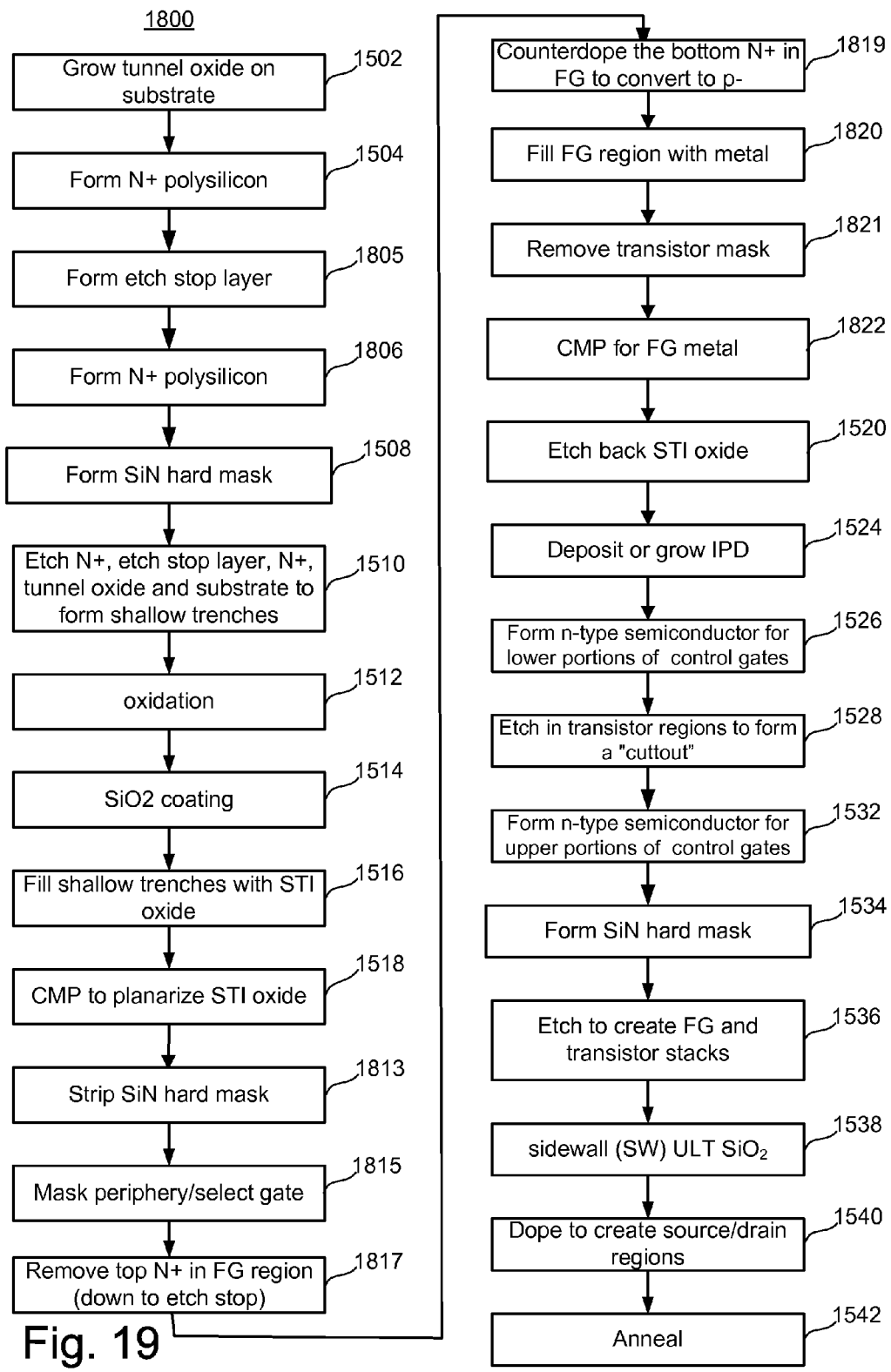
FIG. 19 is a flowchart one embodiment of a process of forming transistors and non-volatile storage elements in which an etch stop layer is used.

FIG. 19 is a flowchart of one embodiment of a process 1800 of forming transistors and non-volatile storage elements. Process 1800 is one embodiment of steps 1402 and 1404 from process 1400. In process 1800, the transistors may be N+ semiconductor near the gate oxide, as well as N+ away from the gate oxide. Process 1800 may be used to form non-volatile storage elements and transistors such as those depicted in FIG. 8G, a well as others not specifically shown or described herein. Note that some steps may be similar to that of process 1500. Therefore, similar reference numerals are used.

After forming the n+ polysilicon layer (or first semiconductor region) in step 1504, an etch stop layer is formed over the n+ polysilicon in step 1805. Note that both the n+ polysilicon layer and the etch stop layer may be formed in both the regions where memory cells are being formed and the peripheral region. However, ultimately the etch stop layer may only be needed where floating gates are being formed.

In step 1806, a region of N+ polysilicon (or second semiconductor region) is formed over the etch stop layer. Note that this N+ semiconductor is formed both in regions where floating gates and where transistor gates are to be formed. However, it will later be removed in the regions where floating gates are to be formed. Results after step 1806 are depicted in FIG. 20A, which shows initial formation in a memory array region and a peripheral region. The various layers include a substrate 340, oxide 1605a, 1605b, N+ semiconductor 2004, etch stop layer 2005, and n+ semiconductor 2008.

Next, steps 1508-1518 are performed. After step 1518, STI trenches have been formed and filled. Moreover, in step 1518 CMP may be used to planarize the STI oxide. Then, in step 1813, the SiN hard mask that was formed in step 1508 may be removed. Next, in step 1815, masking is performed above the regions where select gate transistors are being formed. Masking may also be performed in region where peripheral transistors are being formed.

Then, in step 1817, the N+ polysilicon that was deposited in step 1806 is removed from regions where the floating gates will be formed. Thus, trenches are formed where floating gates are to be formed. Note that portions of the etch stop layer 2005' that was formed in step 1805 may still be in place. In step 1819, counter-doping is performed to convert the n+ semiconductor to p− semiconductor where floating gates are being formed. Note that the counter-doping may be performed through the etch stop layer. FIG. 20B depicts results after step 1819, showing the trenches where floating gates are to be formed. Both n+ semiconductor regions 2004', 2008' still remain where transistor gates are to be formed. A mask 2035 is shown over the n+ semiconductor 2008' where the peripheral transistors is being formed. However, the original n+ semiconductor 2004 has been converted to p− semiconductor 2034 where floating gates are being formed. Note that the perspective of FIG. 20B does not depict the select gate transistor being formed, but there may be a mask over that region at this point in the process to prevent the n+ semiconductor from being removed. Also note that the mask 2035 may prevent the counter-doping from affecting the upper n+ semiconductor 2008 in regions where transistor gates are being formed.

Figure 8G:
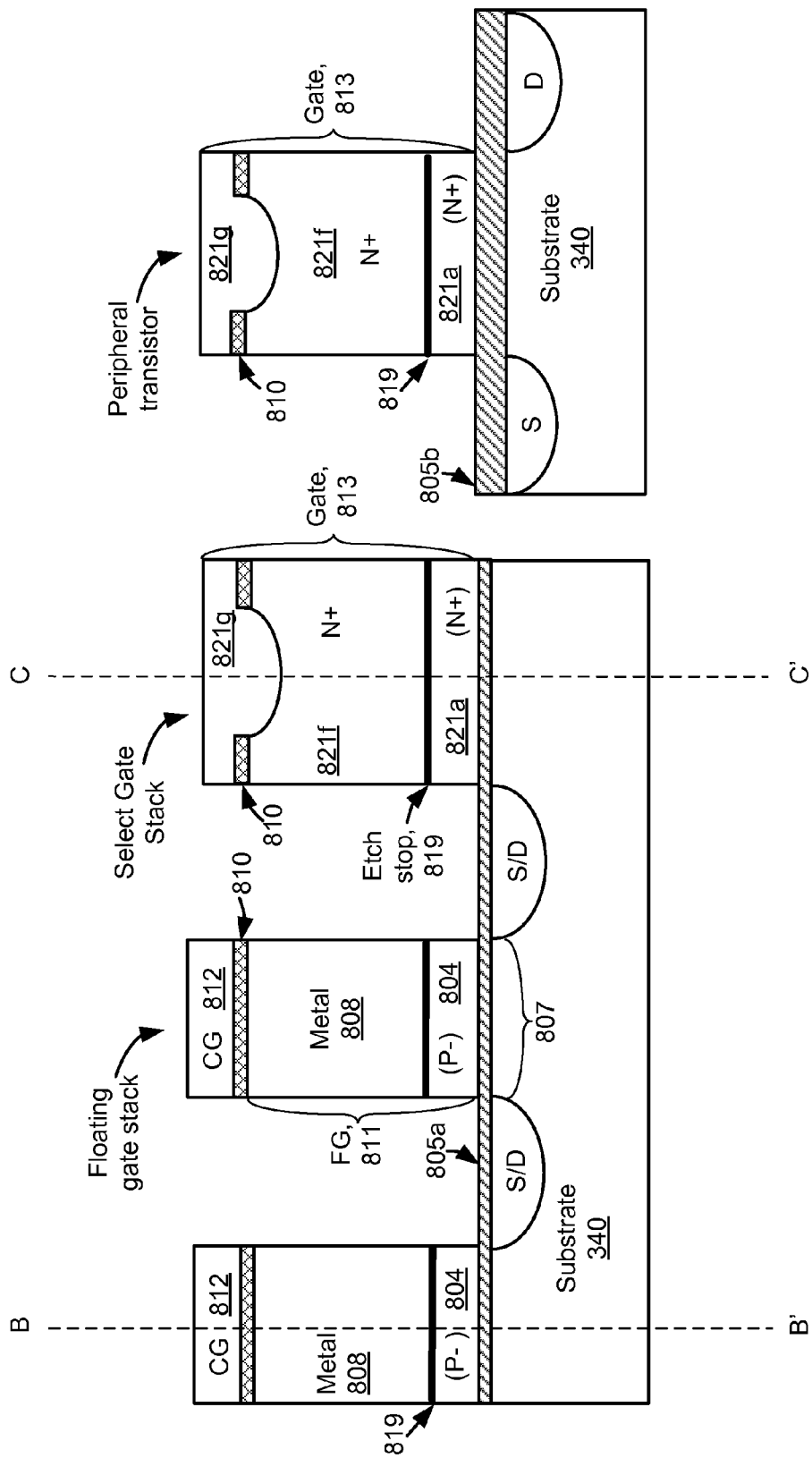
FIG. 8G depicts one embodiment in which floating gates have an etch stop region between a p- region and a metal region, and transistor gates are N+.

In step 1820, the trenches are filled with metal. In step 1821, the mask for the transistors may be removed. In step 1822, CMP of the metal for the floating gates is performed. Results are as depicted in FIG. 20C, which shows metal regions 2007 where floating gates are being formed. Then, the STI oxide may be etched back in step 1520. Next, steps 1524-1542 may be performed to complete processing. Results may be as depicted in FIG. 8G, which shows the etch stop 819 between the p− polysilicon 804 and the metal 808 of the floating gates. As noted, the etch stop 819 may not needed in the transistor gates. However, the etch stop 819 could be present in transistor gate stacks between the N+ region 821a and n+ region 821f.

There are many alternatives to the above described structures and processes within the spirit of the present disclosure. As in the existing NAND embodiments, an alternative is to fabricate the memory cells from PMOS devices with opposite polarity bias conditions for the various operations as compared to the existing NMOS implementation. In the above examples, the substrate is made of silicon. However, other materials known in the art can also be used such as Gallium Arsenide, etc.

One embodiment disclosed herein includes a non-volatile storage element, which may include: a channel region in a substrate, a tunnel oxide over the channel region, a floating gate, a control gate, and an inter-gate dielectric region between the floating gate and the control gate. The floating gate may gave a first region formed from P semiconductor and a second region formed from metal. The first region may border the tunnel oxide over the channel region.

One embodiment disclosed herein includes a memory array comprising a plurality of non-volatile storage elements over a substrate. Each of the non-volatile storage elements may include a tunnel oxide over the substrate, a floating gate, a control gate, and an inter-gate dielectric region between the floating gate and the control gate. The floating gate may have a first region formed from P− semiconductor and a second region formed from metal. The first region of the floating gate may border the tunnel oxide. The second region of the floating gate may border the inter-gate dielectric.

One embodiment disclosed herein includes a method for forming a memory array, which may include the following. Transistors and non-volatile storage elements are formed. An individual transistor may have a gate and a gate oxide. Forming the non-volatile storage elements may include forming a tunnel oxide over a region for a channel in a substrate; forming a floating gate over the tunnel oxide; forming a control gate; and forming an inter-gate dielectric between the second region of the floating gate and the control gate. The floating gate may have a first region formed from P− semiconductor and a second region formed from metal, with first region bordering the tunnel oxide over the channel region.

In one embodiment, forming the transistors and forming non-volatile storage elements includes the following. A P− semiconductor region is formed over an insulator in one or more first regions in which the non-volatile storage elements and in one or more second regions in which the transistors are to be formed. A metal region is formed over the P− semiconductor region in the one or more first regions and in the one or more second regions. Portions of the metal are etched away where the transistor gates are to be formed in the one or more second regions. The P− semiconductor region is counter-doped where transistor gates are to be formed to form an N+ semiconductor region for each of the transistor gates. Floating gates are formed in the one or more first regions from the P− semiconductor region and the metal region that remains in the one or more first regions, wherein the insulator serves as the tunnel oxide. Transistor gates are formed in the one or more second regions, wherein each transistor gate includes at least the respective N+ semiconductor region, the insulator serves as the gate oxide.

In one embodiment, forming the transistors and forming non-volatile storage elements includes the following. An N+ semiconductor region is formed over an insulator in one or more first regions in which the non-volatile storage elements and in one or more second regions in which the transistors are to be formed. An etch stop layer may be formed over the N+ region. A second semiconductor region is formed over the n+ semiconductor region in the one or more first regions and in the one or more second regions. Portions of the second semiconductor region are removed where the floating gates are to be formed in the one or more first regions to form openings. The lowest portions of the floating gates may be counter-doped to convert the n+ semiconductor to p−. The openings are filled with metal. The floating gates are formed in the one or more first regions from the first semiconductor region and the metal. The transistor gates are formed in the one or more second regions, the transistor gates including at least portions of the second semiconductor region.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize the various embodiments and with various modifications as are suited to the particular use contemplated. It is intended that the scope of embodiments be defined by the claims appended hereto.

What is claimed is:

1. A non-volatile storage element comprising:
    a channel region in a substrate;
    a tunnel oxide over the channel region;
    a floating gate over the tunnel oxide, the floating gate having a first region formed from P− semiconductor and a second region formed from metal, the first region borders the tunnel oxide over the channel region, the floting gate has a P−/metal junction;
    a control gate; and
    an inter-gate dielectric region between the second region of the floating gate and the control gate.

2. The non-volatile storage element of claim 1, wherein the first region has a doping concentration such that the first region is inverted near the tunnel oxide when an erase voltage is applied to the control gate.

3. The non-volatile storage element of claim 1, wherein the metal includes one or more of W, WN, TiN, TaN, Mo, and TiO.

4. The non-volatile storage element of claim 1, wherein the floating gate has an upper portion and a lower portion, the first region occupies substantially all of the lower portion, the second region occupies substantially all of the upper portion.

5. The non-volatile storage element of claim 1, wherein the channel region is an n-channel.

6. A memory array comprising:
    a plurality of non-volatile storage elements over a substrate, each of the non-volatile storage elements including:
    a tunnel oxide over the substrate;
    a floating gate over the tunnel oxide, the floating gate having a first region formed from P− semiconductor and a second region formed from metal, the first region of the floating gate borders the tunnel oxide, the floating gate has a P−/metal junction;
    a control gate; and
    an inter-gate dielectric between the second region of the floating gate and the control gate.

7. The memory array of claim 6, further comprising one or more management circuits coupled to the plurality of non-volatile storage elements, the one or more management circuits apply an erase voltage to the control gate of a first of the plurality of non-volatile storage elements, the first region has a doping concentration such that the first region is inverted near the tunnel oxide when the erase voltage is applied to the control gate.

8. The memory array of claim 6, further comprising one or more management circuits coupled to the plurality of non-volatile storage elements, the one or more management circuits apply a program voltage to the control gate of a first of the plurality of non-volatile storage elements, the first region is not depleted near the tunnel oxide when the program voltage is applied.

9. The memory array of claim 6, further comprising a plurality of transistors, each of the transistors having a gate, a channel, and a transistor gate oxide over the channel, the transistor gate having an N+ region bordering the transistor gate oxide.

10. The memory array of claim 6, wherein the floating gate has an upper portion and a lower portion, the first region occupies substantially all of the lower portion, the second region occupies substantially all of the upper portion.

11. A method for forming a memory array comprising:
forming transistors, an individual transistor having a gate and a gate oxide; and
forming non-volatile storage elements, forming the non-volatile storage elements includes:
  forming a tunnel oxide over a region for a channel in a substrate;
  forming a floating gate over the tunnel oxide, the floating gate having a first region formed from P− semiconductor and a second region formed from metal, the first region borders the tunnel oxide over the channel region, the floating gate has a P−/metal junction;
  forming a control gate; and
  forming an inter-gate dielectric between the second region of the floating gate and the control gate.

12. The method of claim 11, wherein the forming transistors and the forming non-volatile storage elements includes:
  forming a P− semiconductor region over an insulator in one or more first regions in which the non-volatile storage elements and in one or more second regions in which the transistors are to be formed;
  forming a metal region over the P− semiconductor region in the one or more first regions and in the one or more second regions;
  forming the floating gates for the non-volatile storage elements in the one or more first regions from the P− semiconductor region and the metal region that remains in the one or more first regions, the insulator serves as the tunnel oxide; and
  forming the transistor gates in the one or more second regions, the transistor gates including at least the metal and the P− semiconductor region, the insulator serves as the gate oxide.

13. The method of claim 11, wherein the forming transistors and the forming non-volatile storage elements includes:
  forming a P− semiconductor region over an insulator in one or more first regions in which the non-volatile storage elements and in one or more second regions in which the transistors are to be formed;
  forming a metal region over the P− semiconductor region in the one or more first regions and in the one or more second regions;
  etching away portions of the metal where the transistor gates are to be formed in the one or more second regions;
  counter-doping the P− semiconductor region where transistor gates are to be formed to form an N+ semiconductor region for each of the transistor gates;
  forming the floating gates in the one or more first regions from the P− semiconductor region and the metal region that remains in the one or more first regions, the insulator serves as the tunnel oxide; and
  forming the transistor gates in the one or more second regions, each transistor gate including at least the respective N+ semiconductor region, the insulator serves as the gate oxide.

14. The method of claim 13, further comprising:
forming polysilicon in the etched away portions of the metal where the transistor gates are to be formed in the one or more second regions and over the metal in the one or more first regions, wherein an individual transistor gate is formed from a portion of the polysilicon and one of the N+ semiconductor regions.

15. The method of claim 14, further comprising:
forming control gates for the non-volatile storage elements from the polysilicon.

16. The method of claim 13, further comprising:
forming metal in the etched away portions of the metal where transistor gates are to be formed in the one or more second regions and over the metal in the one or more first regions, wherein the transistor gates are formed from the metal and the N+ semiconductor region.

17. The method of claim 11, wherein the forming transistors and the forming non-volatile storage elements includes:
  forming a first semiconductor region over an insulator in one or more first regions in which the non-volatile storage elements and in one or more second regions in which the transistors are to be formed, the first semiconductor region is n+;
  forming a second semiconductor region over the first semiconductor region in the one or more first regions and in the one or more second regions;
  removing the second semiconductor region where the floating gates are to be formed in the one or more first regions to form openings;
  counter-doping the first semiconductor region in regions where floating gates are being formed to convert the first semiconductor region to p− where floating gates are being formed;
  filling the openings with metal;
  forming the floating gates in the one or more first regions from the first semiconductor region and the metal; and
  forming the transistor gates in the one or more second regions, the transistor gates including at least portions of the second semiconductor region.

18. The method of claim 17, further comprising:
forming an etch stop between the first semiconductor region and the second semiconductor region in the one or more first regions and in the one or more second regions.

* * * * *

UNITED STATES PATENT AND TRADEMARK OFFICE
CERTIFICATE OF CORRECTION

| | | |
|---|---|---|
| PATENT NO. | : 8,503,229 B2 | Page 1 of 1 |
| APPLICATION NO. | : 13/153964 | |
| DATED | : August 6, 2013 | |
| INVENTOR(S) | : Lee et al. | |

It is certified that error appears in the above-identified patent and that said Letters Patent is hereby corrected as shown below:

In the Claims

Column 22, Claim 1, Line 7 (column 22, line 15), please change "floting" to --floating--.

Signed and Sealed this
Twenty-fourth Day of December, 2013

Margaret A. Focarino
*Commissioner for Patents of the United States Patent and Trademark Office*